United States Patent
Kubota et al.

(10) Patent No.: US 11,774,562 B2
(45) Date of Patent: *Oct. 3, 2023

(54) LIGHT DETECTOR AND DISTANCE MEASURING DEVICE COMPRISING PLURAL SETS OF LIGHT DETECTION ELEMENTS WITH PLURAL SELECTION CIRCUITS

(71) Applicants: KABUSHIKI KAISHA TOSHIBA, Tokyo (JP); Toshiba Electronic Devices & Storage Corporation, Tokyo (JP)

(72) Inventors: Hiroshi Kubota, Fussa (JP); Nobu Matsumoto, Ebina (JP)

(73) Assignees: KABUSHIKI KAISHA TOSHIBA, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/717,606

(22) Filed: Apr. 11, 2022

(65) Prior Publication Data

US 2022/0236385 A1    Jul. 28, 2022

Related U.S. Application Data

(63) Continuation of application No. 16/563,595, filed on Sep. 6, 2019, now Pat. No. 11,333,747.

(30) Foreign Application Priority Data

Mar. 14, 2019 (JP) ................. 2019-046820

(51) Int. Cl.
*G01S 7/486* (2020.01)
*G01S 7/4863* (2020.01)
(Continued)

(52) U.S. Cl.
CPC ............. *G01S 7/4863* (2013.01); *G01J 1/44* (2013.01); *G01S 7/487* (2013.01); *G01S 17/10* (2013.01);
(Continued)

(58) Field of Classification Search
CPC .......... G01J 1/44; H04N 25/77; H04N 25/75; H04N 25/79; G01S 7/486; G01S 17/06; G01S 17/04; G01S 17/10; H01L 31/107
(Continued)

(56) References Cited

U.S. PATENT DOCUMENTS

| | | |
|---|---|---|
| 8,969,990 B2 | 3/2015 | Nagano et al. |
| 9,109,953 B2 | 8/2015 | Sasaki et al. |

(Continued)

FOREIGN PATENT DOCUMENTS

| | | |
|---|---|---|
| JP | 2010-78338 A | 4/2010 |
| JP | 2014-241543 A | 12/2014 |

(Continued)

OTHER PUBLICATIONS

P. Buzhan, et al., "An Advanced Study of Silicon Photomultiplier", ICFA Instrumentation Bulletin, Fall 2001 Issue, 2001, 14 pages.

*Primary Examiner* — Que Tan Le
(74) *Attorney, Agent, or Firm* — Oblon, McClelland, Maier & Neustadt, L.L.P.

(57) ABSTRACT

According to one embodiment, a light detector includes: a first set of light detection elements and a second set of light detection elements each being disposed in a first region on a substrate; and a first selection and integration circuit and a second selection and integration circuit each being disposed in a second region outside of the first region on the substrate. The first selection and integration circuit is configured to select a first subset of light detection elements in the first set, and integrate outputs from the light detection (Continued)

elements in the first subset. The second selection and integration circuit is configured to select a second subset of light detection elements in the second set, and integrate outputs from the light detection elements in the second subset.

10 Claims, 14 Drawing Sheets

(51) Int. Cl.
    *G01J 1/44*     (2006.01)
    *G01S 7/487*     (2006.01)
    *G01S 17/10*     (2020.01)
    *H01L 31/107*     (2006.01)

(52) U.S. Cl.
    CPC .... *H01L 31/107* (2013.01); *G01J 2001/4466* (2013.01)

(58) Field of Classification Search
    USPC .......................................... 250/214 R, 208.1
    See application file for complete search history.

(56) References Cited

U.S. PATENT DOCUMENTS

| | | | |
|---|---|---|---|
| 10,031,243 | B2 | 7/2018 | Yamakawa et al. |
| 10,050,069 | B2 | 8/2018 | Yamamura et al. |
| 10,398,006 | B2 | 8/2019 | Nakamura |
| 2011/0168909 | A1 | 7/2011 | Nakao et al. |
| 2017/0242108 | A1 | 8/2017 | Dussan et al. |
| 2018/0031420 | A1 | 2/2018 | Dyba |
| 2018/0081040 | A1 | 3/2018 | Kubota et al. |
| 2019/0086522 | A1 | 3/2019 | Kubota et al. |
| 2019/0296074 | A1 | 9/2019 | Kokubun et al. |
| 2020/0292670 | A1 | 9/2020 | Kubota et al. |
| 2020/0300621 | A1 | 9/2020 | Kubota et al. |
| 2022/0385851 | A1* | 12/2022 | Gray .................... H04N 25/677 |

FOREIGN PATENT DOCUMENTS

| | | |
|---|---|---|
| JP | 2015-78953 A | 4/2015 |
| JP | 5791461 B2 | 10/2015 |
| JP | 2016-80442 A | 5/2016 |
| JP | 6134844 B2 | 5/2017 |
| JP | 2018-44923 A | 3/2018 |
| JP | 2018-512573 A | 5/2018 |
| JP | 2020-150128 A | 9/2020 |
| JP | 2029-153929 A | 9/2020 |
| WO | WO 2017/112416 A1 | 6/2017 |
| WO | WO 2017/180277 A1 | 10/2017 |

\* cited by examiner

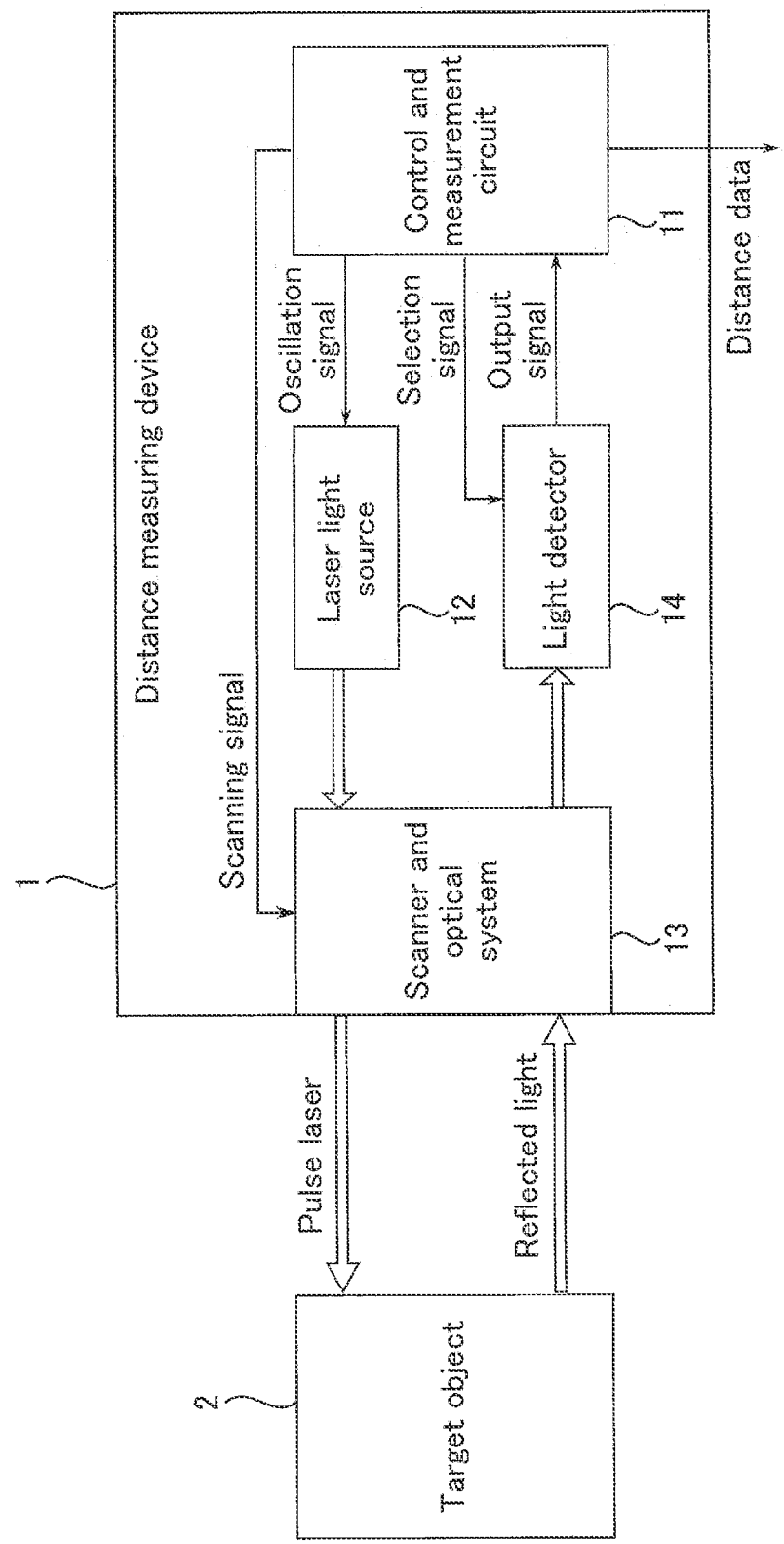
F I G. 1

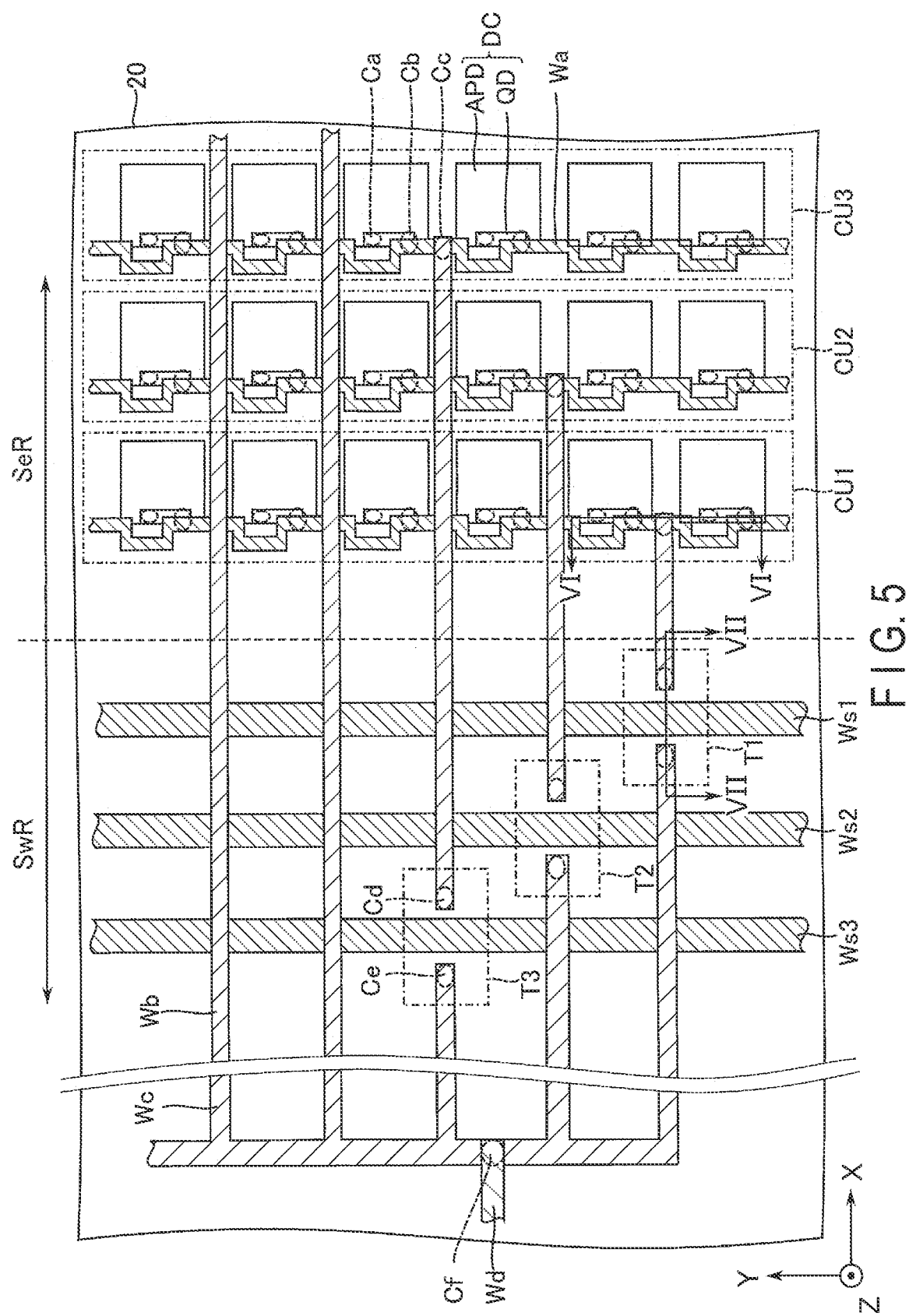
F I G. 5

LIGHT DETECTOR AND DISTANCE MEASURING DEVICE COMPRISING PLURAL SETS OF LIGHT DETECTION ELEMENTS WITH PLURAL SELECTION CIRCUITS

CROSS-REFERENCE TO RELATED APPLICATIONS

This application is a continuation of U.S. application Ser. No. 16/563,595 filed Sep. 6, 2019, which is based upon and claims the benefit of priority from Japanese Patent Application No. 2019-046820, filed Mar. 14, 2019, the entire contents of each of which are incorporated herein by reference.

FIELD

Embodiments described herein relate generally to a light detector and a distance measuring device.

BACKGROUND

A light detector that detects reflected light of laser emitted on a target object, and a distance measuring device including the light detector is known.

BRIEF DESCRIPTION OF THE DRAWINGS

FIG. 1 is a block diagram for describing a configuration of a distance measuring device including a light detector according to a first embodiment;

FIG. 5 is a plain view for describing layout of a channel unit in the light detector according to the first embodiment, and a selection and integration circuit corresponding to the channel unit;

DETAILED DESCRIPTION

Figure 2:
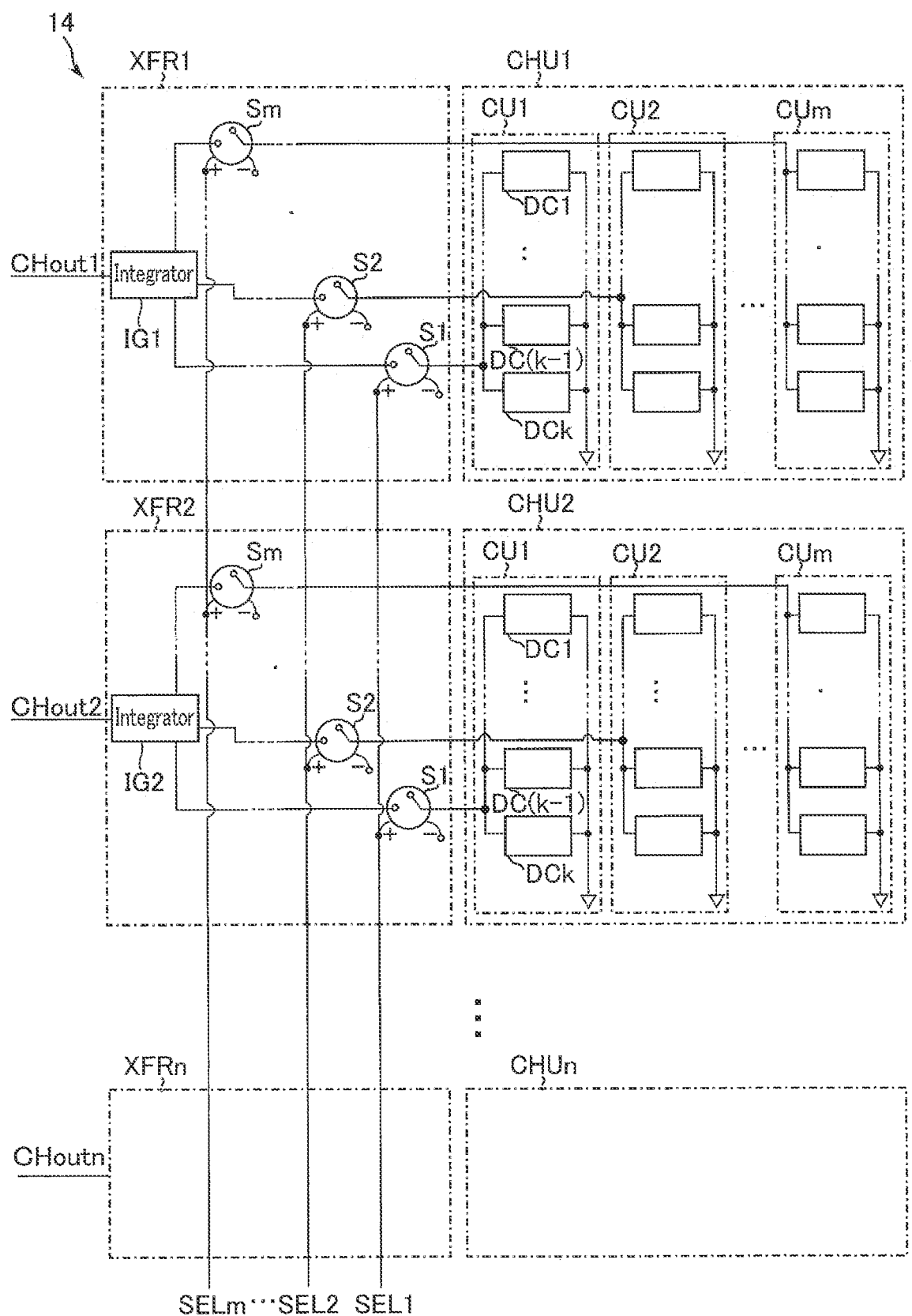
FIG. 2 is a block diagram for describing a functional configuration of the light detector according to the first embodiment.

In general, according to one embodiment, a light detector includes: a first set of light detection elements and a second set of light detection elements each being disposed in a first region on a substrate; and a first selection and integration circuit and a second selection and integration circuit each being disposed in a second region outside of the first region on the substrate. The first selection and integration circuit is configured to select a first subset of light detection elements in the first set, and integrate outputs from the light detection elements in the first subset. The second selection and integration circuit is configured to select a second subset of light detection elements in the second set, and integrate outputs from the light detection elements in the second subset.

Hereinafter, embodiments will be described with reference to the drawings. In addition, in the following description, components having the same function and configuration are assigned common reference symbols. In addition, a plurality of components having common reference symbols are distinguished from each other by adding suffixes to the common reference symbols. In addition, if a plurality of components need not be specifically distinguished, the components are assigned only common reference symbols and suffixes are not added thereto.

In the following description, in a case where ($\beta \leq \alpha \leq \gamma$) using integers $\beta$ and $\gamma$ is recited at the end of a specific sentence that describes components using an integer $\alpha$ as a suffix, all integers more than $\beta$ and less than $\gamma$ can be applied to the integer $\alpha$ in sentences after the specific sentence.

1. First Embodiment

A light detector according to the first embodiment and a distance measuring device including the light detector will be described. The distance measuring device according to the first embodiment is, for example, a light detection and ranging (LiDAR) that measures a distance from a target object using laser, and the light detector according to the first embodiment is, for example, a photomultiplier (semiconductor photon-multiplier, and in particular, silicon photon-multiplier (SiPM)) that can be integrated on a semiconductor substrate.

1.1 Configuration

A configuration of the distance measuring device including the light detector according to the first embodiment will be described.

1.1.1 Configuration of Distance Measuring Device

FIG. 1 is a block diagram for describing a configuration of the distance measuring device according to the first embodiment.

As illustrated in FIG. 1, a distance measuring device 1 is configured to measure a distance between a target object 2 and the distance measuring device 1. The distance measuring device 1 can correspond to a part of an in-vehicle system (not illustrated), for example. The target object 2 is, for example, a tangible object such as another passenger vehicle, a pedestrian, and an obstacle that exists in front of or behind a passenger vehicle on which the distance measuring device 1 is mounted. The target object 2 may exist diagonally in front of, diagonally behind, and the side of the distance measuring device 1.

The distance measuring device 1 includes a control and measurement circuit 11, a laser light source 12, a scanner and optical system 13, and a light detector 14.

The control and measurement circuit 11 is a circuit that controls the entire operation of the distance measuring device 1. More specifically, the control and measurement circuit 11 transmits an oscillation signal to the laser light source 12 and controls laser emission performed by the laser light source 12. The control and measurement circuit 11 transmits a scanning signal to the scanner and optical system 13 and physically or optically drives the scanner and optical system 13, and controls a scanning direction of laser to be irradiated onto the target object 2. The control and measurement circuit 11 transmits a selection signal to the light detector 14 and selects light detection elements that detect light to be emitted into the light detector 14. In addition, upon receiving an output signal as a light detection result from the light detector 14, the control and measurement circuit 11 calculates a distance between the target object 2 and the distance measuring device 1 based on the output signal, and outputs distance data including the calculated distance.

Based on the oscillation signal from the control and measurement circuit 11, the laser light source 12 emits laser to the scanner and optical system 13. The laser is, for example, pulse laser, and emitted with a predetermined pulse width and cycle.

The scanner and optical system 13 includes, for example, a scanner and an optical system including a irradiation optical system and a light receiving system. The scanner and optical system 13 is configured to change an emission direction of laser to be emitted to the outside of the distance measuring device 1 via the irradiation optical system, by driving an internal scanner based on the scanning signal from the control and measurement circuit 11. More specifically, for example, the scanner and optical system 13 includes a one-dimensional scanning system configured to change the emission direction to a predetermined direction, and is configured to thoroughly emit laser to a predetermined two-dimensional range by repeating one-dimensional laser scanning a plurality of times while being shifted slightly in a direction crossing the predetermined direction. Furthermore, the scanner of the scanner and optical system 13 may be configured to scan laser by rotating a stage (not illustrated) on which the irradiation optical system is mounted, or may be configured to scan laser by driving a mirror constituting the optical system.

In addition, the light receiving system of the scanner and optical system 13 condenses light including reflected light produced by emitted laser being reflected on the target object 2, to the light detector 14. Aside from reflected light, the light receiving system of the scanner and optical system 13 also receives environmental light and stray light (light generated in an apparatus), but the environmental light and the stray light correspond to noise. Hereinafter, for the sake of simplicity, environmental light will be collectively referred to as "reflected light", simply.

Upon receiving reflected light from the scanner and optical system 13, the light detector 14 generates electrons corresponding to the number of photons included in the reflected light, at every cycle of pulse laser to be emitted by the laser light source 12, for example. The light detector 14 according to the first embodiment is configured to generate hundred thousand multiples of electrons for each photon, for example. The light detector 14 generates an output signal according to the number of generated electrons, and outputs the output signal to the control and measurement circuit 11. The detailed configuration of the light detector 14 will be described later.

1.1.2 Configuration of Light Detector

Next, the configuration of the light detector according to the first embodiment will be described.

First, a functional configuration of the light detector according to the first embodiment will be described with reference to FIG. 2.

As illustrated in FIG. 2, the light detector 14 includes a plurality of channel units (groups, or sets) CHU (CHU1, CHU2, . . . , CHUn) and a plurality of selectors and integrators (hereinafter, for the sake of explanatory convenience, will also be simply referred to as "selection and integration circuits") XFR (XFR1, XFR2, . . . , XFRn) (n is integer of two or more). A selection and integration circuit XFRi corresponds to a channel unit CHUi (1≤i≤n).

Each of the plurality of channel units CHU includes a plurality of cell units (subsets) CU (CU1, CU2, . . . , CUm) (m is integer of two or more). Each of the plurality of cell units CU includes a plurality of light detection elements (detection cells) DC (DC1, DC2, . . . , DCk) (k is integer of two or more). The light detection element DC is a minimum unit of generating electrons corresponding to the number of photons included in the reflected light in the light detector 14.

The selection and integration circuit XFRi includes a plurality of selectors S (S1, S2, . . . , Sm) and an integrator IGi. A selector Sj in the selection and integration circuit XFRi corresponds to a cell unit CUj in a corresponding channel unit CHUi (1≤j≤m).

First ends of all the light detection elements DC in the cell unit CUj in the channel unit CHUi are grounded and second ends are coupled in common to a first end of the selector Sj in the corresponding selection and integration circuit XFRi. The selector S is an electronic circuit that can functionally select a signal transmittable state or signal non-transmittable state based on selection signal input to the selector S. Second ends of all the selectors Sj in the selection and integration circuit XFRi are input to the integrator IGi that functionally performs integration (addition on the output current), and output thereof is coupled to an output node CHouti. In addition, the selectors Sj of each of the plurality of selection and integration circuits XFR are coupled in common to the same selection node SELj serving as a supply source of selection signals. Therefore, the selection signals are supplied to the selectors S.

With the above-described configuration, via a selector Sj selected by the selection node SELj, the cell unit CUj corresponding to the selector Sj in each of the channel units CHUi is coupled to a output node CHouti, and the output of the cell unit CUj is added to the output of the output node CHouti. In other words, the selection node SELj can select the cell unit CUj to be output to an output node CHouti for the channel unit CHUi.

Figure 3:
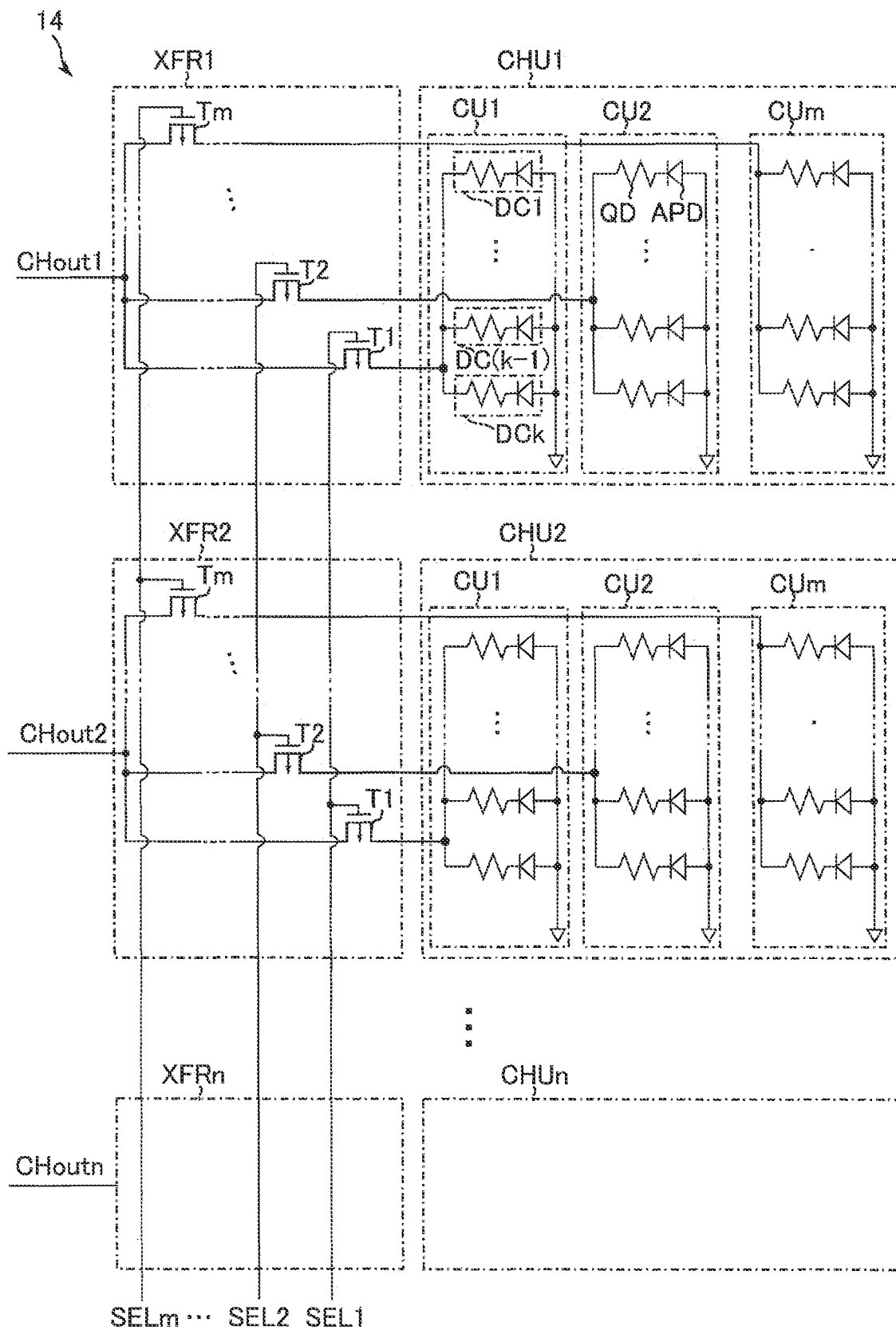
FIG. 3 is a circuit diagram for describing a circuit configuration of the light detector according to the first embodiment.

Next, a circuit configuration of the light detector according to the first embodiment will be described with reference to FIG. 3. FIG. 3 corresponds to FIG. 2, and illustrates an example of a specific circuit configuration to which the functional configuration of the light detector 14 illustrated in FIG. 2 is applied.

As illustrated in FIG. 3, each of the plurality of light detection elements DC includes a diode APD and a quench resistor QD that are connected in series, for example.

The diode APD is, for example, an avalanche photo diode, and includes an input end (anode) coupled to a biased power supply and an output end (cathode) coupled to a first end of the quench resistor QD. Input ends of all the diodes APD in the light detector 14 are coupled to the same voltage and are biased to breakdown voltage of avalanche break down or more (e.g. about −30 V) with each output end. Upon receiving reflected light from the scanner and optical system 13, the diode APD can thereby initiate Geiger discharge by causing avalanche breakdown with some probability.

The quench resistor QD functions as a quench resistor that suppresses a potential difference between both ends of the diode APD that has caused avalanche breakdown, to less than breakdown voltage. In addition, in place of one quench resistor QD, an active quench circuit configured to perform quenching at higher speed may be used. In other words, in the following description, the quench resistor QD may be replaced with the active quench circuit and an output end of the quench resistor QD may be read as an output end of the active quench circuit. In the case of the quench resistor QD, an output signal becomes an analog current signal, but in the case of the active quench circuit, an output signal sometimes may become a digital signal. By the quench resistor QD or the like, the diode APD can stop Geiger discharge, and can initiate Geiger discharge again by receiving reflected light after a certain period of time. Because a time from when the diode APD generates Geiger discharge to when Geiger discharge is enabled to be initiated again is extremely smaller than the above-described cycle of laser pulse, periodic measurement becomes executable. In the following description, the cycle of the measurement will also be referred to as a "measurement cycle".

Each of a plurality of selection and integration circuits XFR includes a plurality of switching elements T (T1, T2, . . . , Tm). A switching element Tj in the selection and integration circuit XFRi corresponds to a cell unit CUj in a corresponding channel unit CHUi (1≤j≤m). The switching element T corresponds to the selector S in FIG. 2, for example, and a metal-oxide-semiconductor (MOS) transistor having p-type conductivity.

Second ends of all the quench resistors QD in the cell unit CUj in the channel unit CHUi are coupled in common to the first end of the switching element Tj in the corresponding selection and integration circuit XFRi. In addition, the switching elements Tj of each of the plurality of selection and integration circuits XFR are coupled in common to the same selection node SELj. Second ends of all the switching elements T in the selection and integration circuit XFRi are coupled in parallel to the output node CHouti. In this manner, by coupling the switching elements T in parallel, current signals can be integrated, and a circuit equivalent to the integrator IG can be formed.

In addition, the output node CHout is set to potential of about 0 V to several V, for example. Reverse bias can thereby be applied to the diode APD in the light detection element DC to such a degree that avalanche breakdown can be initiated, when the switching element T turns into an on state. Thus, the channel unit CHUi in the light detector 14 can output, at every measurement cycle, the total current generated in a plurality of light detection elements DC in the selected cell unit CUj, to the output node CHouti.

1.1.3 Layout of Distance Measuring Device

Figure 4:
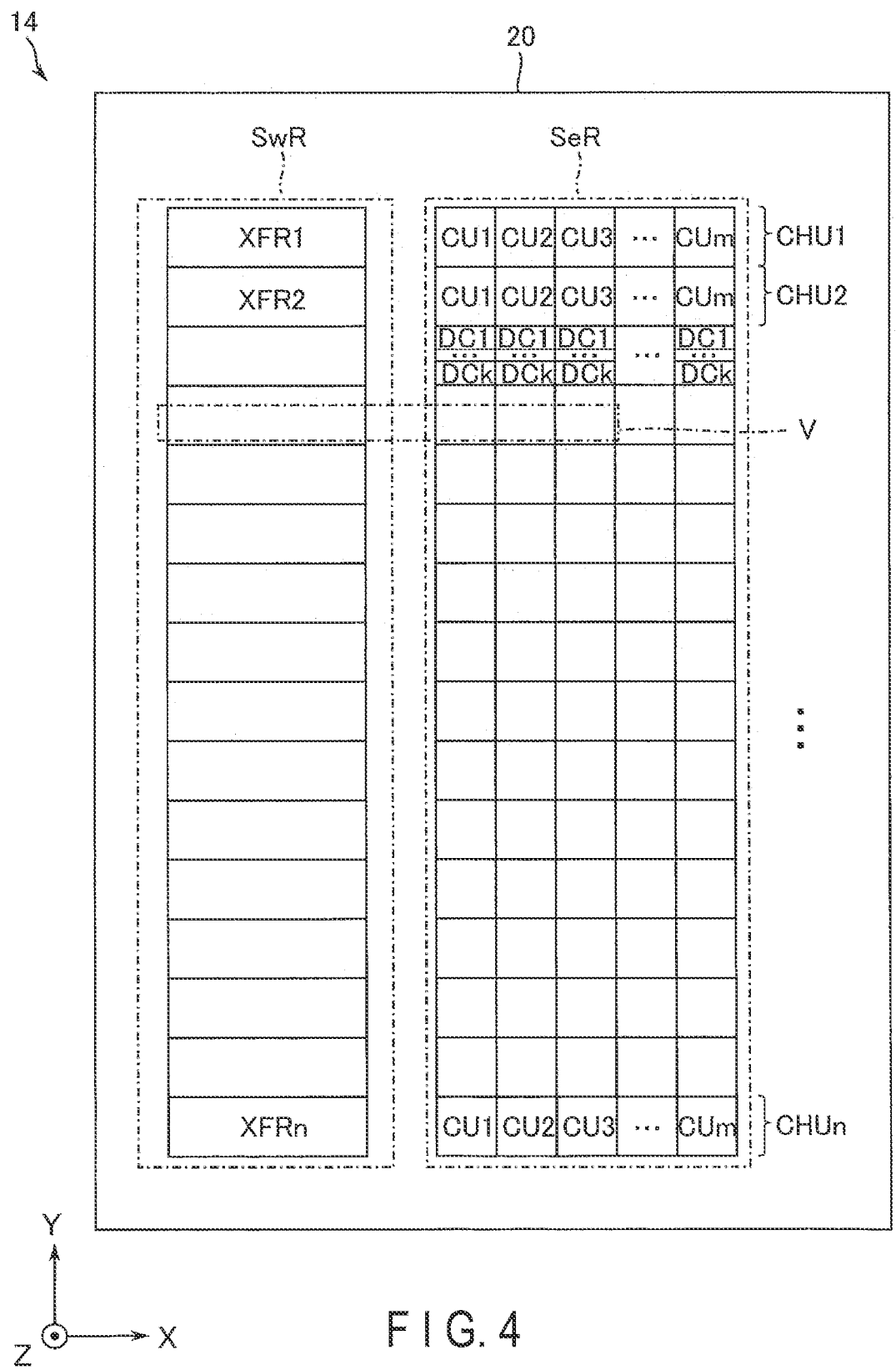
FIG. 4 is a plain view for describing overall layout of the light detector according to the first embodiment.

Next, layout of the light detector according to the first embodiment will be described using plain views illustrated in FIGS. 4 and 5. FIG. 4 illustrates overall layout of a plurality of channel units CHU and a plurality of selection and integration circuits XFR. FIG. 5 illustrates detailed layout of a part of a set of a certain channel unit CHUi and a selection and integration circuit XFRi in the overall layout illustrated in FIG. 4.

First, overall layout of a plurality of channel units CHU and a plurality of selection and integration circuits XFR will be described with reference to FIG. 4.

As illustrated in FIG. 4, the light detector 14 is formed on a semiconductor substrate 20. In the following description, a top surface of the semiconductor substrate 20 extends along an x-y plane in which an X-axis and the Y-axis vertically intersecting with each other stretch, and an axis vertical to the x-y plane is a Z-axis. In addition, an XYZ right-handed system in which a direction heading for the top surface from the semiconductor substrate 20 becomes a Z-axis positive direction is defined. Furthermore, the Z-axis may correspond to an incident axis of reflected light from the scanner and optical system 13, for example.

On the semiconductor substrate 20, the light detector 14 includes two regions not overlapping with each other, that is to say, a sensor region SeR and a switch region SwR. The sensor region SeR is defined as single region (for example, the minimum rectangle) encompassing all the channel units CHU on the semiconductor substrate 20 in a planar view, for example. The switch region SwR is defined as single region (for example, the minimum rectangle) encompassing all the selection and integration circuits XFR on the semiconductor substrate 20 in a planar view, for example. The sensor region SeR and the switch region SwR are arranged in the X-axis, for example.

In the sensor region SeR, a plurality of channel units CHU are arranged along the Y-axis, for example. In the channel unit CHUi, a plurality of cell units CU are arranged along the X-axis, for example. A plurality of cell units CUj respectively included in corresponding channel units CHUi are arranged along the Y-axis.

In the cell unit CUj, a plurality of light detection elements DC are arranged in the Y-axis, for example. A plurality of light detection elements DC respectively included in corresponding cell units CUj are arranged along the X-axis.

By the above-described arrangement, the cell unit CU has a width corresponding to one light detection element DC along the X-axis, and has a width corresponding to k light detection elements DC along the Y-axis. The channel unit CHU has a width corresponding to m cell units CU along the X-axis, and a width corresponding to one cell unit CU along the Y-axis. The sensor region SeR has a width corresponding to about one channel unit CHU along the X-axis, and a width corresponding to about n channel units CHU along the Y-axis. Furthermore, unlike the sensor region SeR, there are no physical and optical restrictions on the shape of the switch region SwR. Thus, the switch region SwR can be designed with relatively high degree of freedom.

In addition, in the switch region SwR, a plurality of selection and integration circuits XFR are arranged in the Y-axis, for example. The selection and integration circuit XFRi and the corresponding channel unit CHUi are arranged in the X-axis.

By the above-described arrangement, the switch region SwR has a width corresponding to about one selection and integration circuit XFR along the X-axis, and has a width corresponding to about n selection and integration circuits XFR along the Y-axis. In addition, as described above, the switch region SwR and the sensor region SeR are arranged so as not to overlap with each other.

Next, detailed layout of a part of a set of the channel unit CHUi and the selection and integration circuit XFRi will be described with reference to FIG. 5. FIG. 5 illustrates an enlarged view of a region V illustrated in FIG. 4, out of the sensor region SeR and the switch region SwR. In FIG. 5, for the sake of convenience, an interlayer dielectric film formed on the semiconductor substrate 20 is appropriately omitted.

As illustrated in FIG. 5, on the semiconductor substrate 20, in the sensor region SeR, for example, a plurality of light detection elements DC is formed in a matrix. Among the light detection elements DC, light detection elements DC arranged in the Y-axis belong to the same cell unit CU, for example. The diode APD in each of the light detection elements DC is formed on the semiconductor substrate 20 into a substantially rectangular shape. The diode APD functions as a light receiving surface (sensor surface) of reflected light from the scanner and optical system 13.

The quench resistor QD has an elongated belt-like with respect to the sensor surface of the diode APD in a planar view, for example. The quench resistor QD is formed above the rim of the diode APD in a planar view so as not to block reflected light to the sensor surface of the corresponding diode APD, for example, and is coupled to the diode APD via a contact Ca.

A plurality of quench resistors QD in the same cell unit CU are coupled in common to an interconnect Wa formed on an upper layer, via a contact Cb, for example. The interconnect Wa is formed in such a manner that a portion overlapped with the sensor surfaces of a plurality of diodes APD arranged substantially in the Y-axis becomes small, for preventing reflected light from being blocked to the sensor surfaces of the diodes APD. In addition, for suppressing the generation of unintended parasitic capacity, the interconnect Wa is sometimes laid around the contact Ca in a planar view. The interconnect Wa is formed for each cell unit CU.

Above the interconnect Wa, an interconnect Wb coupled to the interconnect Wa via a contact Cc is formed. The interconnect Wb extends along the X-axis between two diodes APD adjacent along the Y-axis, so as not to block reflected light to the sensor surfaces of the diodes APD, for example. The interconnect Wb is formed for each cell unit CU.

The interconnect Wb is coupled to the first end of the corresponding switching element T via a contact Cd. The second end of the switching element T is coupled to an interconnect Wc via a contact Ce. The interconnect Wc is coupled in common to second ends of a plurality of switching elements T in the selection and integration circuit XFR. An interconnect Ws extending substantially along the Y-axis is formed between the first end and the second end of the switching element T. The interconnect Ws corresponds to the selection node SEL.

Above the interconnect Wc, an interconnect Wd coupled to the interconnect Wc via a contact Cf is formed. The interconnect Wd corresponds to the output node CHout, for example.

With the above-described configuration, the sensor region SeR and the switch region SwR are arranged so as not to overlap with each other. Specifically, one channel unit CHU and the selection and integration circuit XFR are coupled via m interconnects Wb extending along the X-axis. In addition, m cell units CU are respectively selected by m interconnects Ws extending along the Y-axis in the switch region SwR, via the corresponding switching elements T.

1.1.4 Cross-Sectional Structures of Light Detection Element and Switch Element

Figure 6:
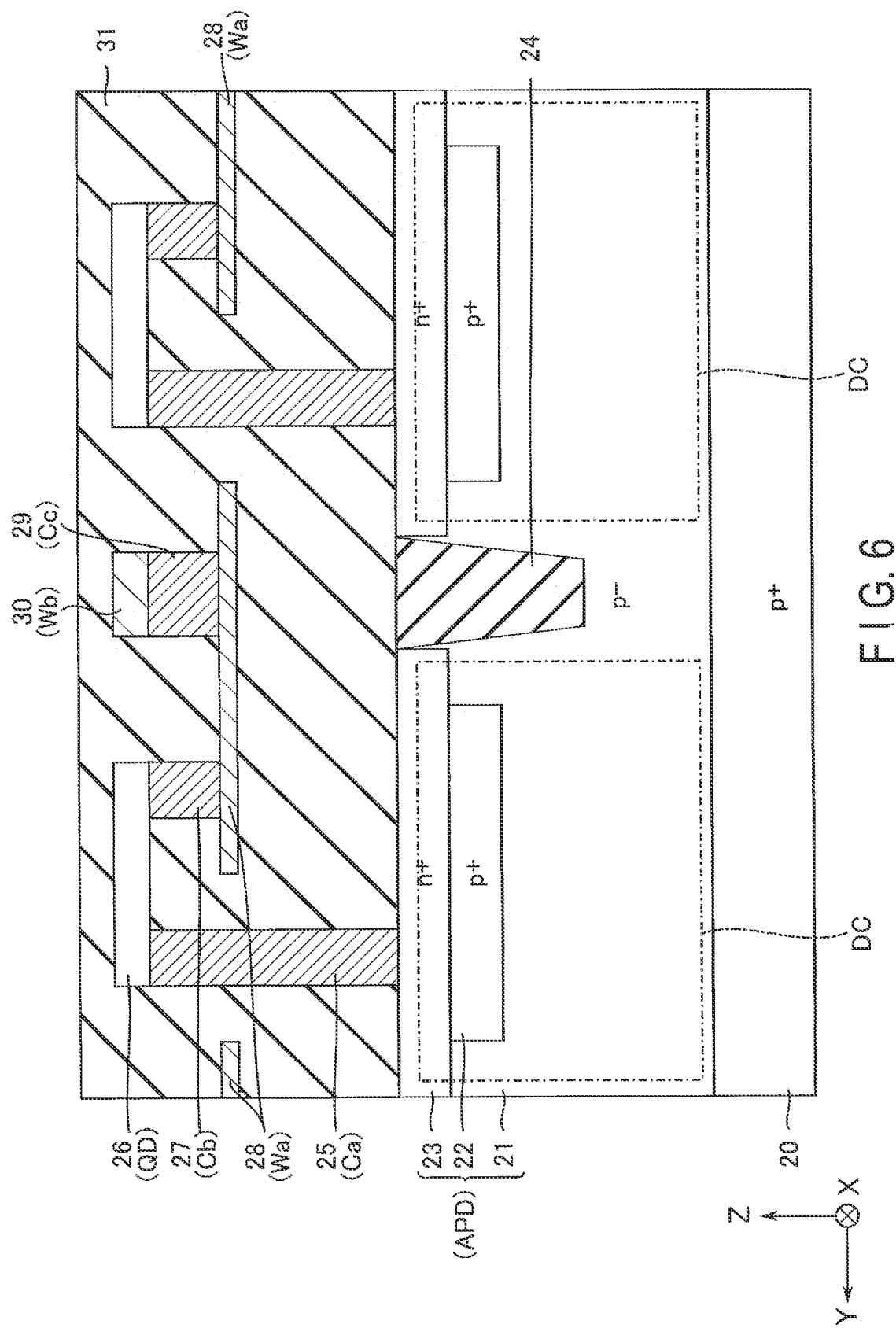
FIG. 6 is a cross-sectional view for describing a cross-sectional structure of a light detection element in the light detector according to the first embodiment.
Figure 7:
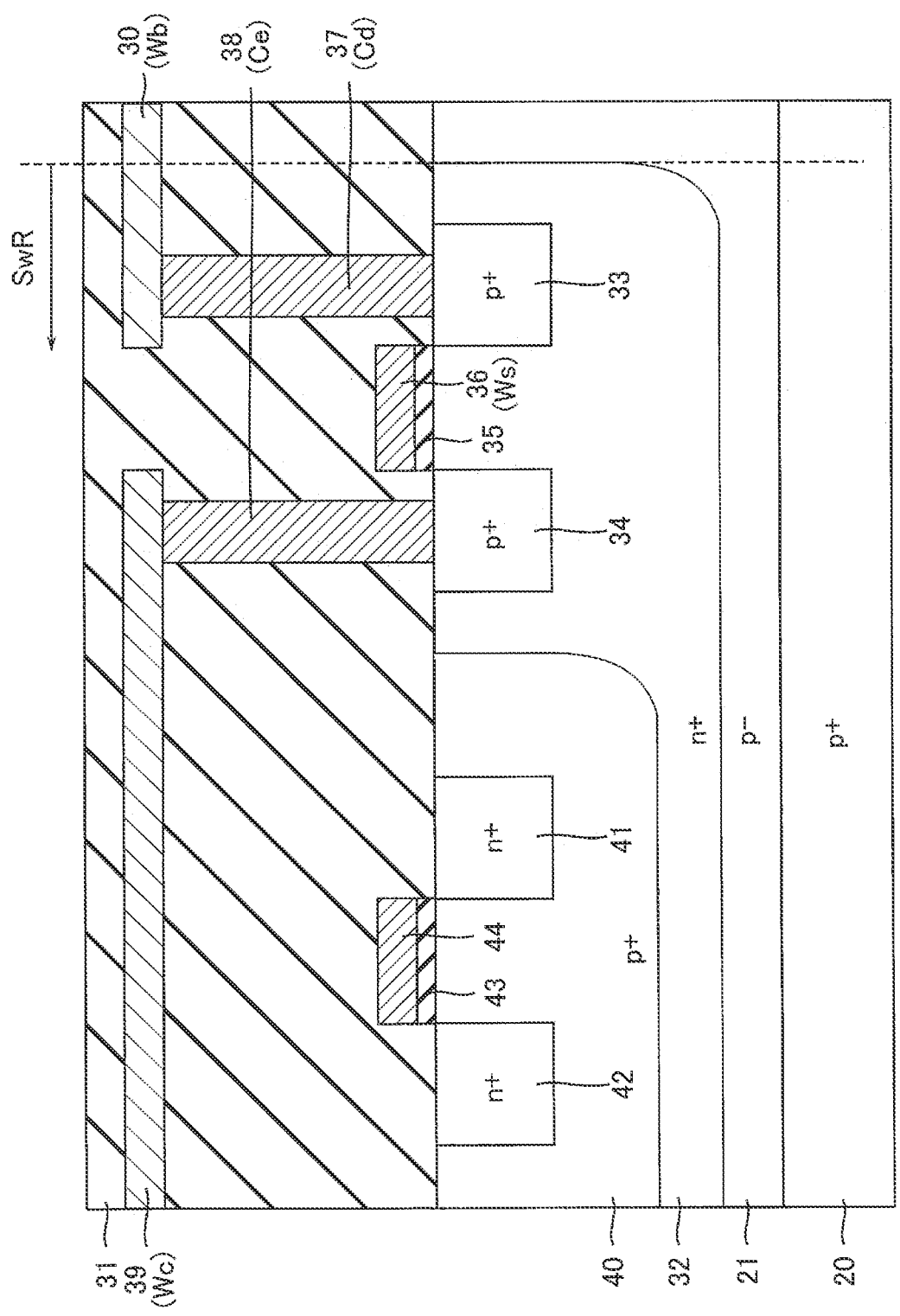
FIG. 7 is a cross-sectional view for describing a cross-sectional structure of a switching element in the light detector according to the first embodiment.

Next, cross-sectional structures of the light detection element and the switching element according to the first embodiment will be described using FIGS. 6 and 7, respectively. FIGS. 6 and 7 respectively illustrate cross sections cut along lines VI-VI and VII-VII illustrated in FIG. 5.

First, the cross-sectional structure of the light detection element DC will be described with reference to FIG. 6.

As illustrated in FIG. 6, the semiconductor substrate 20 is a $p^+$-type silicon substrate, for example. A $p^-$-type semiconductor layer 21 is formed on the semiconductor substrate 20.

On the $p^-$-type semiconductor layer 21, in a region in which the light detection element DC is formed, a $p^+$-type semiconductor layer 22 and an $n^+$-type semiconductor layer 23 are sequentially formed along the Z axis. The $n^+$-type semiconductor layer 23 positions on the surface side of the $p^+$-type semiconductor layer 22, and covers the $p^+$-type semiconductor layer 22 in a planar view, for example. In addition, an insulator 24 is sometimes formed between the $p^+$-type semiconductor layers 22 and the $n^+$-type semiconductor layers 23 respectively formed in the adjacent two light detection elements DC. The adjacent two $p^+$-type semiconductor layers 22 and $n^+$-type semiconductor layers 23 are thereby separated from each other. In the above-described manner, one set of the $p^-$-type semiconductor layer 21, the $p^+$-type semiconductor layer 22, and the $n^+$-type semiconductor layer 23 forms the diode APD.

On the top surface of the $n^+$-type semiconductor layer 23, a conductor 25 functioning as the contact Ca is provided. On the top surface of the conductor 25, a semiconductor or conductor 26 (hereinafter, for the sake of convenience, will be referred to as a conductor 26) functioning as the quench resistor QD is provided along the Y-axis, for example. The top surface of the conductor 25 contacts the bottom surface of the first end in the Y-axis of the conductor 26, for example.

On the bottom surface of the second end in the Y-axis of the conductor 26, a conductor 27 functioning as the contact Cb is provided. On the bottom surface of the conductor 27, a conductor 28 functioning as the interconnect Wa is provided in the x-y plane, for example. One conductor 28 is connected in common to a plurality of conductors 27 arranged along the Y-axis, for example. In addition, as described in FIG. 5, for suppressing parasitic capacity generated between conductors 25, the conductor 28 can be provided so as not to pass through immediately above the conductor 25, for example.

On the top surface of the conductor 28, a conductor 29 functioning as the contact Cc is provided. The conductor 29 is provided on the top surface of the conductor 28 and is provided above the insulator 24 provided between the two light detection elements DC adjacent along the Y-axis, for example. The top surface of the conductor 29 contacts the bottom surface of the first end in the X-axis of a conductor 30 functioning as the interconnect Wb, for example. As described above, because the conductor 30 is provided so as to extend along the X-axis, the conductor 30 is provided between the two light detection elements DC adjacent along the Y-axis.

The conductors 25 to 30 are covered by an interlayer dielectric film 31, for example. For the interlayer dielectric film 31, for example, material that can transmit reflected light from the scanner and optical system 13 is used.

Next, the cross-sectional structure of the switching element T will be described with reference to FIG. 7.

As illustrated in FIG. 7, in the switch region SwR, on the $p^-$-type semiconductor layer 21, for example, an $n^+$-type semiconductor layer 32 is formed in a range encompassing a region in which all the switching elements T are formed. A $p^+$-type semiconductor layers 33 and 34 is formed on the $n^+$-type semiconductor layer 32. The $p^+$-type semiconductor layers 33 and 34 function as a drain or a source of the switching element T by being formed on the top surface of the semiconductor substrate 20. In this manner, because the switching element T is formed in a region in which p+-type impurity diffusion regions are surrounded by the n+-type semiconductor layer 32, the switching element T is made less likely to be affected by a voltage fluctuation in the p−-type semiconductor layer 21 that is attributed to an outside region of the switch region SwR (e.g. the sensor region SeR). Nevertheless, because high voltage is applied to the light detection element DC, in some cases, a predetermined interval may be designed between the switch region SwR and the sensor region SeR for separating the switch region SwR from the sensor region SeR.

The p+-type semiconductor layers 33 and 34 are arranged in the Y-axis at an interval corresponding to a gate length, for example. An insulator 35 functioning as a gate insulator film is provided on a portion of the top surface of the n+-type semiconductor layer 32 that is located between the p+-type semiconductor layers 33 and 34. The insulator 35 includes oxide silicon ($SiO_2$), for example. A conductor 36 functioning as the interconnect Ws is provided on the top surface of the insulator 35. By extending along the Y-axis, the conductor 36 is coupled in common to gates of a plurality of switching elements T (not illustrated) arranged in the Y-axis.

On the top surface of the p+-type semiconductor layer 33, a conductor 37 functioning as the contact Cd is provided. The top surface of the conductor 37 contacts the bottom surface of the second end in the X-axis of the conductor 30 that reached the switch region SwR along the X-axis from the sensor region SeR. On the top surface of the p+-type semiconductor layer 34, a conductor 38 functioning as the contact Ce is provided. The top surface of the conductor 38 contacts the bottom surface of the first end in the X-axis of a conductor 39 functioning as the interconnect Wc.

With the above-described configuration, the light detection element DC can be coupled to the switching element T via the interconnect Wb extending along the X-axis, and can be finally coupled to the interconnect Wc.

In the switch region SwR, in addition to a MOS transistor having a p-type conductivity, a MOS transistor having an n-type conductivity may also be formed. In this case, a p+-type semiconductor layer 40 is formed on the n+-type semiconductor layer 32 and n+-type semiconductor layers 41 and 42 are formed on the p+-type semiconductor layer 40. The n+-type semiconductor layers 41 and 42 function as a drain or a source of the n-type MOS transistor by being formed on the top surface of the semiconductor substrate 20. The n+-type semiconductor layers 41 and 42 are arranged in the Y-axis at an interval corresponding to a gate length, for example. An insulator 43 functioning as a gate insulator film is provided on a portion of the top surface of the p+-type semiconductor layer 40 that is located between the n+-type semiconductor layers 41 and 42. The insulator 43 includes oxide silicon ($SiO_2$), for example. A conductor 44 functioning as an interconnect is provided on the top surface of the insulator 43. By causing the conductor 44 to function as the interconnect Ws, the n-type MOS transistor can also be caused to function as the switching element T.

1.2 Operation

Next, an operation of the distance measuring device according to the first embodiment will be described.

1.2.1 Distance Measuring Processing

Figure 8:
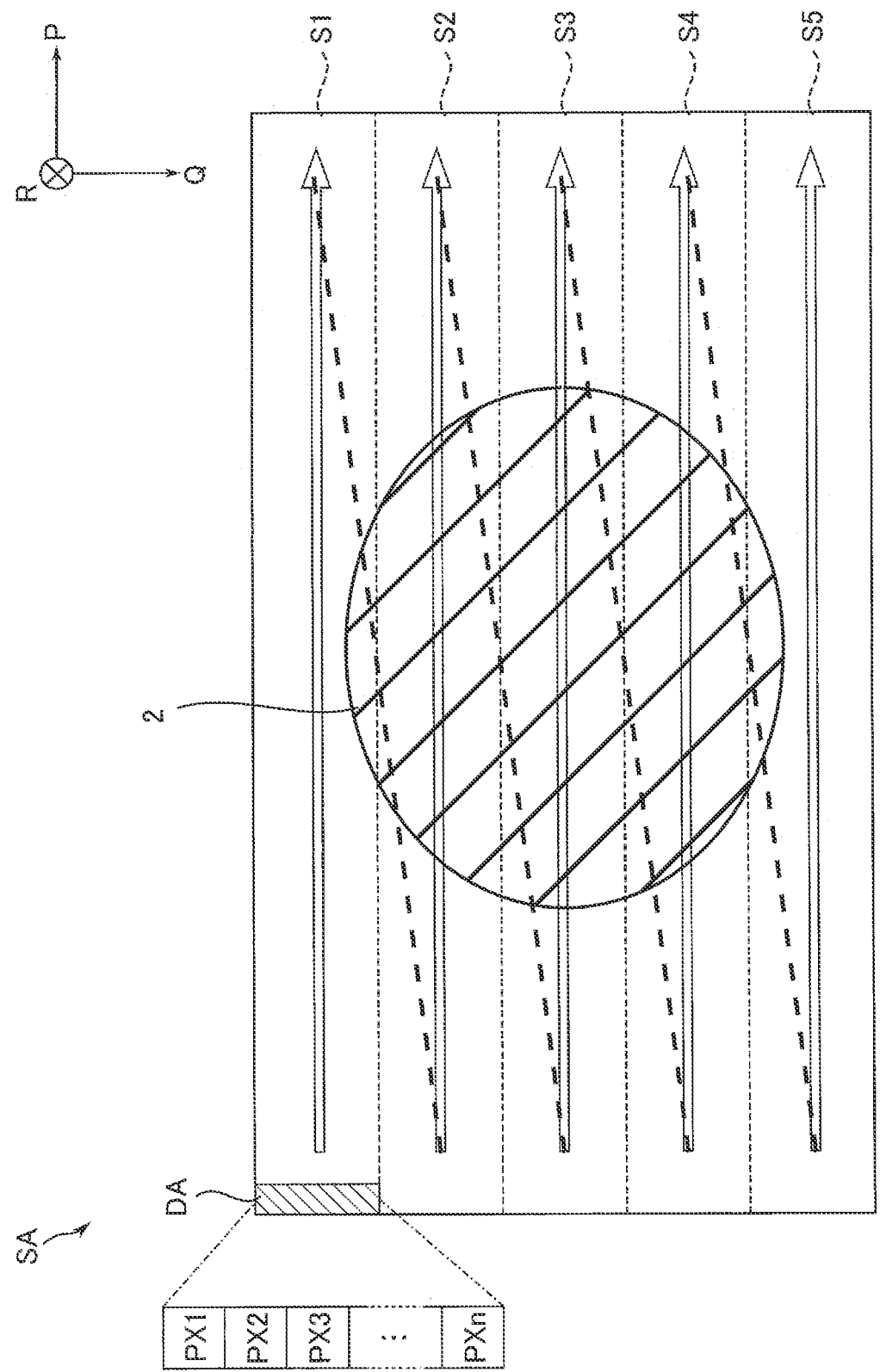
FIG. 8 is a schematic diagram for describing a distance measuring process in the distance measuring device according to the first embodiment.

FIG. 8 is a schematic diagram for describing a distance measuring process in the distance measuring device according to the first embodiment. FIG. 8 schematically illustrates a region to be scanned by laser emitted from the scanner and optical system 13, and visualized distance data of the target object 2 that is obtained by scanning of the laser. In the example in FIG. 8, laser is emitted onto a PQR space. An R-axis is an axis extending toward the target object 2 from a passenger vehicle or the like on which the distance measuring device 1 is mounted, and extends along the center of the emission direction of laser, for example. A PQ-surface is a curved surface that is orthogonal to the R-axis and concentrically spreads from an emission port of laser. A P-axis and a Q-axis are axes orthogonal to each other in the PQ-surface. The distance data is generated as mapping onto the PQ-surface, for example. In the following description, a region in the PQ-surface through which laser passes is defined as a laser scanning region SA.

The distance measuring device 1 generates, at every measurement cycle, for example, a plurality of pieces of distance data corresponding to a detection region DA smaller than the laser scanning region SA. The detection region DA includes, for example, n pixels PX (PX1, PX2, PX3, ..., and PXn), and one piece of distance data is generated for each of the pixels PX. The n pixels PX are arranged in the Q-axis, for example. For example, the n pixels PX arranged in the Q-axis correspond to n channel units CHU arranged in the Y-axis. In other words, the distance measuring device 1 generates, at every measurement cycle, distance data corresponding to a pixel PXi, based on an output signal output from the output node CHouti.

The distance measuring device 1 repeatedly executes the above-described process at every measurement cycle while one-dimensionally shifting the detection region DA along the P-axis by driving the scanner and optical system 13. The distance measuring device 1 can thereby generate distance data related to a region corresponding to a first row S1 in the laser scanning region SA. In some cases, in successive detection, detection regions overlap. In other cases, detection regions are separated. In many cases, detection regions are separated.

In addition, the distance measuring device 1 executes processes equivalent to the above-described process executed to the first row S1, also to a second row S2 to a fifth row S5 in the laser scanning region SA. The distance measuring device 1 can thereby generate distance data over the entire region of the laser scanning region SA, and can eventually map distance data to an object existing in the space PQR, to the laser scanning region SA. Accordingly, the distance measuring device 1 can recognize a distance to the target object 2 in the space PQR.

In the distance measuring device 1 that uses laser, for accurately measuring a target located at a more distant place, a irradiation angle of laser emission and a view angle of the light receiving system is narrowly focused (normally, view angle≥irradiation angle). The view angle corresponds to a detection region. On the other hand, as indicated by the shape of the detection region DA illustrated in FIG. 8, in the example illustrated in FIG. 8, because n channels (pixels) are measured at a time, a irradiation angle and a view angle in the Q direction cannot be narrowed in principle and become large to some extent. Accordingly, for accurately measuring a target located at a distant place, it is important to reduce a irradiation angle and a view angle in the P direction. Here, the P direction corresponds to the X direction on the sensor surface, and in the same optical system, a view angle is substantially proportional to the length of the sensor surface.

1.2.2 Sensor Surface Selection Process

Figure 9:
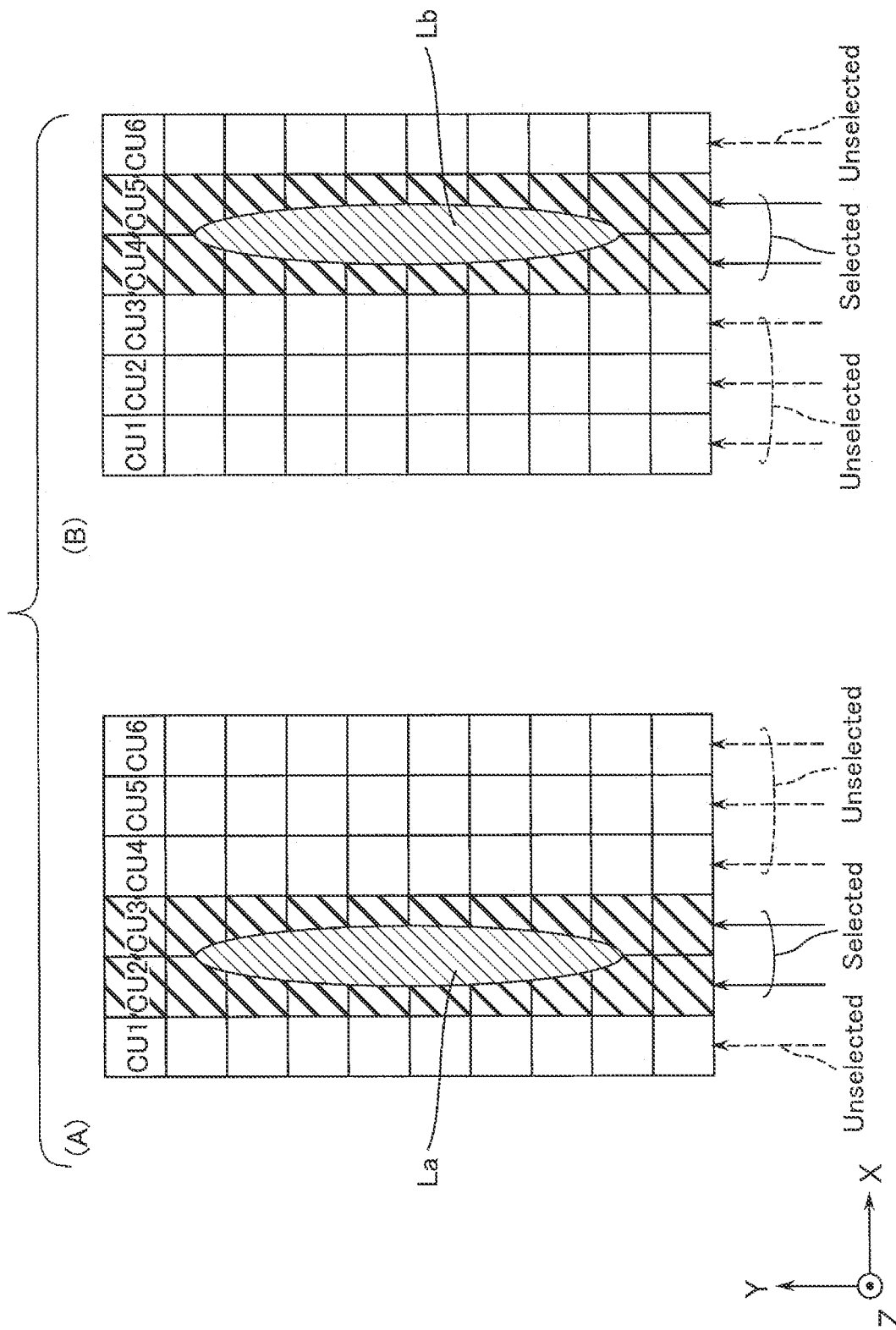
FIG. 9 is a schematic diagram for describing a selection process of a detection range of reflected light in the light detector according to the first embodiment.

Next, a selection process of a sensor surface in the distance measuring device according to the first embodiment will be described using FIG. 9. In FIG. 9, in the sensor region SeR in the light detector 14, a region including the light detection element DC coupled to the output node CHout and to be integrated their output signals, and a region including the light detection element DC electrically disconnected to the output node CHout and not to be integrated their output signals are schematically distinguished. More specifically, a left part (A) and a right part (B) in FIG. 9 respectively illustrate cases where light is received in mutually different regions of the sensor region SeR. In addition, in the example in FIG. 9, for the sake of explanatory convenience, one channel unit CHU includes six cell units CU1 to CU6 (m=6).

As illustrated in (A) in FIG. 9, in a case where light La is received in a region in the sensor region SeR in which cell units CU2 and CU3 are arranged, signals with an "L" level are input to selection nodes SEL2 and SEL3 among selection nodes SEL, and signals with an "H" level are input to selection nodes SEL1, and SEL4 to SEL6. The "L" level is a logical level that can turn the switching element T into the on state, and the "H" level is a logical level that can turn the switching element T into an off state. With this configuration, in each channel unit CHU, light detection elements DC in the cell units CU2 and CU3 are selectively electrically connected to the output node CHout, and light detection elements DC in the cell units CU1 and CU4 to CU6 are electrically disconnected from the output node CHout. Thus, influence of unnecessary light other than reflected light to be received by the light detection elements DC in the cell units CU1 and CU4 to CU6 can be excluded, and distance data that is based on reflected light of laser from an object located at a more distant place can be calculated more accurately.

On the other hand, as illustrated in (B) in FIG. 9, in a case where light Lb is received in a region in the sensor region SeR in which cell units CU4 and CU5 are arranged, signals with the "L" level are input to selection nodes SEL4 and SEL5 among selection nodes SEL, and signals with the "H" level are input to selection nodes SEL1 to SEL3, and SEL6. With this configuration, in each channel unit CHU, light detection elements DC in the cell units CU4 and CU5 are selectively electrically connected to the output node CHout, and light detection elements DC in the cell units CU1 to CU3 and CU6 are electrically disconnected from the output node CHout. Thus, influence of unnecessary light other than reflected light to be received by the light detection elements DC in the cell units CU1 to CU3 and CU6 can be excluded, and distance data that is based on reflected light of laser can be calculated accurately.

1.3 Effect According to Present Embodiment

According to the first embodiment, degradation in signal-to-noise ratio (S/N ratio) of an output signal can be suppressed. Hereinafter, effects according to the present embodiment will be described.

The semiconductor substrate 20 on which the light detector 14 is formed is separated into the sensor region SeR and the switch region SwR. The switch region SwR is arranged outside the sensor region SeR on the semiconductor substrate 20. Specifically, the switch region SwR is arranged next to the sensor region SeR in X direction. More specifically, the sensor region SeR is defined as single region (for example, the minimum rectangle) including all light detection elements DC to be formed, in a planar view, and the switch region SwR is defined as single region (for example, the minimum rectangle) including all switching elements T to be formed, in a planar view. A ratio (opening ratio) of an area of the sensor surface with respect to an area of a light receiving region in the sensor region SeR can thereby be increased, and sensitivity to reflected light can be enhanced.

As supplementation, large reverse bias of about −30 V is applied to the sensor region SeR on the semiconductor substrate 20 for producing avalanche breakdown in the diode APD. On the other hand, for providing the switching element T on the same semiconductor substrate 20, for example, the $n^+$-type semiconductor layer 32 is formed as a well region in the switch region SwR. In addition, for separating the switch region SwR from the influence of large reverse bias in the sensor region SeR, regions may be required to be separated by a predetermined interval in some cases. In this case, if the sensor region SeR and the switch region SwR are arranged so as to overlap in a planar view, a plurality of well regions may exist in the sensor region SeR and a space for separation may be required each time a switching element is formed. Accordingly, because the sensor region SeR includes an area not contributing to the detection of reflected light and a viewing field of the light receiving surface eventually spreads, which is more undesirable.

According to the first embodiment, in the sensor region SeR, light detection elements DC are formed in a matrix in the X direction and the Y direction with being separated from the switching elements T. Thus, it is possible to enhance the density of the sensor surface in the sensor region SeR and reduce the viewing field of the light receiving surface, as compared with a case where the switch region SwR is included in the sensor region SeR.

In addition, a plurality of light detection elements DC arranged in the Y direction forms a cell unit CU, and is coupled to a common output node CHout via one switching element T. A plurality of cell units CU arranged in the X direction forms a channel unit CHU, and is coupled to a common output node CHout via mutually different switching elements T and integrated. An appropriate cell unit CU can thereby be selected using the corresponding switching element T separately formed outside the sensor region SeR. Thus, if the irradiation optical system and the light receiving system are shifted, instead of adjusting the optical system, by using the shift function, adjustment can be electrically performed. The electrical adjustment can be automated by an apparatus equivalent to an apparatus described in Japanese Patent Application No. 2016-181776, filed Sep. 16, 2016, for example. In addition, even if the light receiving region is shifted in the X direction due to factors such as aging degradation, vibration, and a temperature change, by selecting an appropriate cell unit CU, influence of unnecessary environmental light can be reduced. Accordingly, degradation in S/N ratio of the output signals from the light detector 14 can be suppressed, and eventually, deterioration in measurable distance and accuracy can be suppressed.

In addition, cell units CU in respective channel units CHU are simultaneously selected by a corresponding one selection node SEL. The selection node SEL extends along the Y direction in the switch region SwR. This can array channel units CHU in the Y direction while separating the switch region SwR and the sensor region SeR. Furthermore, a plurality of channel units CHU arranged in the Y direction corresponds to a plurality of pixels PX (detection region DA) arranged one-dimensionally (Y direction). The control and measurement circuit 11 can thereby shift the detection regions DA one-dimensionally (P direction) by scanning the scanner and optical system 13, and distance data can be obtained over the laser scanning region SA.

2. Second Embodiment

Next, a distance measuring device according to a second embodiment will be described. The second embodiment differs from the first embodiment in that an unselected cell units CU are electrically connected to a node different from the output node CHout, and a part of light detection elements DC do not function as a light detection element DC (function as dummy cells). Hereinafter, the description of configurations and operations that are equivalent to the first embodiment will be omitted, and configurations and operations that are different from the first embodiment will be mainly described.

2.1 Configuration of Light Detector

Figure 10:
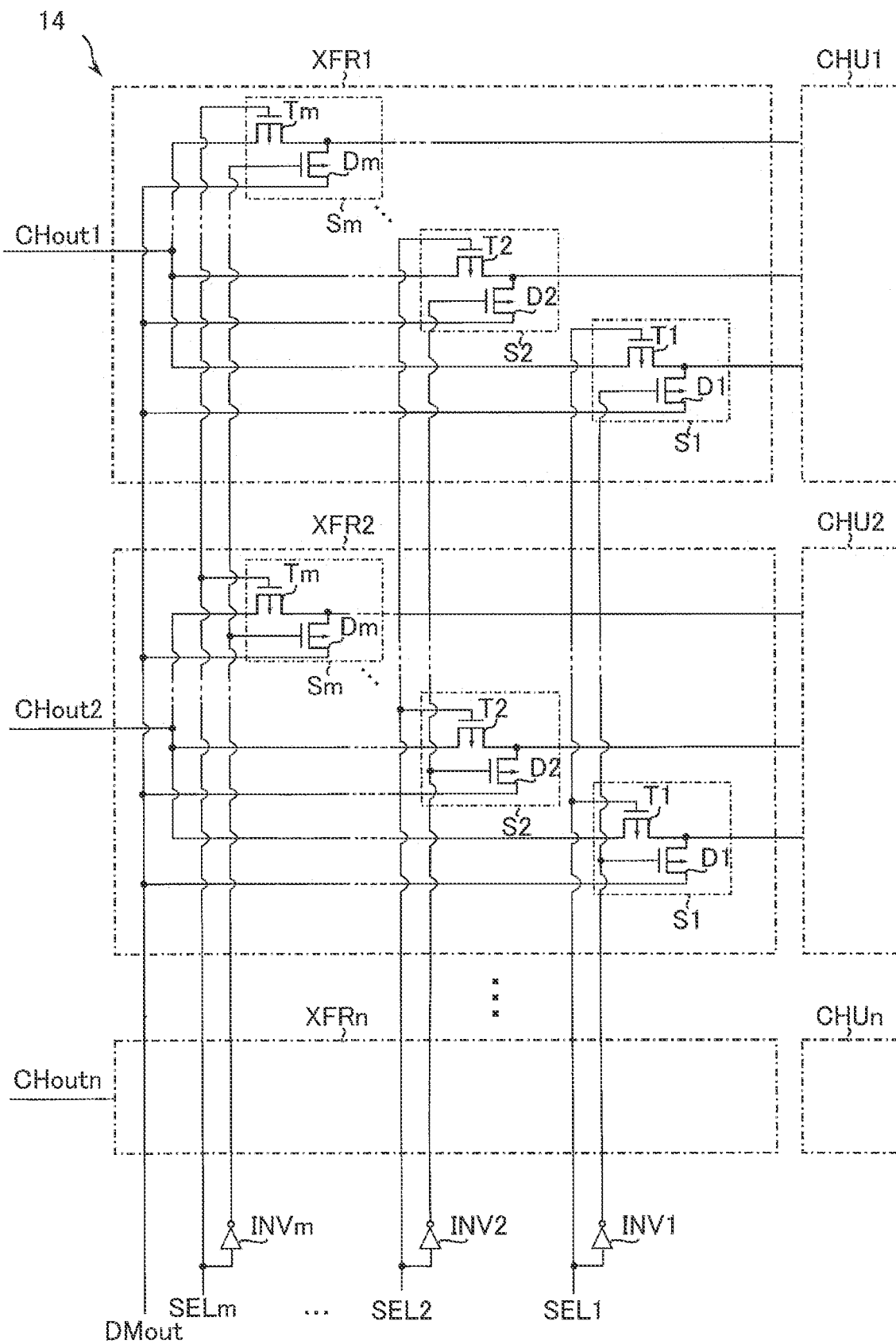
FIG. 10 is a circuit diagram for describing a circuit configuration of a light detector according to a second embodiment.

FIG. 10 is a circuit diagram for describing a configuration of the light detector according to the second embodiment. FIG. 10 illustrates a configuration in which a selector S illustrated in FIG. 2 in the first embodiment is implemented by a switching element D in addition to a switching element T. In FIG. 10, circuit configurations of selection and integration circuits XFR1 and XFR2 in a switch region SwR are mainly illustrated. For the sake of explanatory convenience, circuit configurations of other selection and integration circuits XFR3 to XFRn in the switch region SwR, and channel units CHU in the sensor region SeR are omitted.

As illustrated in FIG. 10, a selection and integration circuit XFRi corresponding to a channel unit CHUi includes a switching element Dj corresponding to a switching element Tj ($1 \leq i \leq n$, $1 \leq j \leq m$). In other words, the selection and integration circuit XFRi includes m switching elements D.

More specifically, second ends of all quench resistors QD in a cell unit CUj in the channel unit CHUi are coupled in common to respective first ends of the switching elements Tj and Dj in the corresponding selection and integration circuit XFRi. The switching element Dj is a MOS transistor having p-type conductivity, for example. Respective second ends of all the switching elements D in all the selection and integration circuits XFR are coupled in common to an output node DMout.

In addition, in the switch region SwR, an inverter INV corresponding to each of m selection nodes SEL is provided. More specifically, an inverter INVj corresponding to a selection node SELj includes an input end coupled in common to gates of m switching elements Tj coupled to the selection node SELj, and an output end coupled in common to gates of m switching elements Dj corresponding to the m switching elements Tj.

With the above-described configuration, one of corresponding two switching elements T and D is controlled to turn into the on state and the other one is controlled to turn into the off state, according to a logical level ("H" level or "L" level) input to the selection node SEL. All the light detection elements DC electrically disconnected to n output nodes CHout are thereby electrically connected to the output node DMout. Thus, by light detection elements DC electrically disconnected to the output node CHout receiving light, influence on the output to the output node CHout can be suppressed.

In addition, for example, voltage that makes reverse bias voltage generated in the diode APD smaller than the output node CHout (equal to or smaller than break voltage, and for example, −3 V to −8 V) is supplied to the output node DMout. With this configuration, even if a light detection element DC coupled to the output node DMout unintentionally receives light, reverse bias is not applied to the diode APD to such a degree that avalanche breakdown can be initiated. Thus, Geiger current flowing in the output node DMout can be suppressed. Additionally, in the second embodiment, the light detector 14 is configured to supply mutually different voltages to the n output nodes CHout. More specifically, for example, the light detector 14 supplies, to a plurality of output nodes CHout, voltage to such a degree that avalanche breakdown can be surely initiated in the light detection elements DC (e.g. 0 V to several V). On the other hand, the light detector 14 supplies, to a plurality of remaining output nodes CHout, voltage to such a degree that avalanche breakdown is surely not initiated (e.g. about −10 V). Channel units CHU in the sensor region SeR can thereby be classified into channel units CHU that can detect light and channel units CHU that cannot detect light. Voltage to be supplied to each of the n output nodes CHout may be made settable after shipment or may be preset.

2.2 Sensor Surface Selection Process

Figure 11:
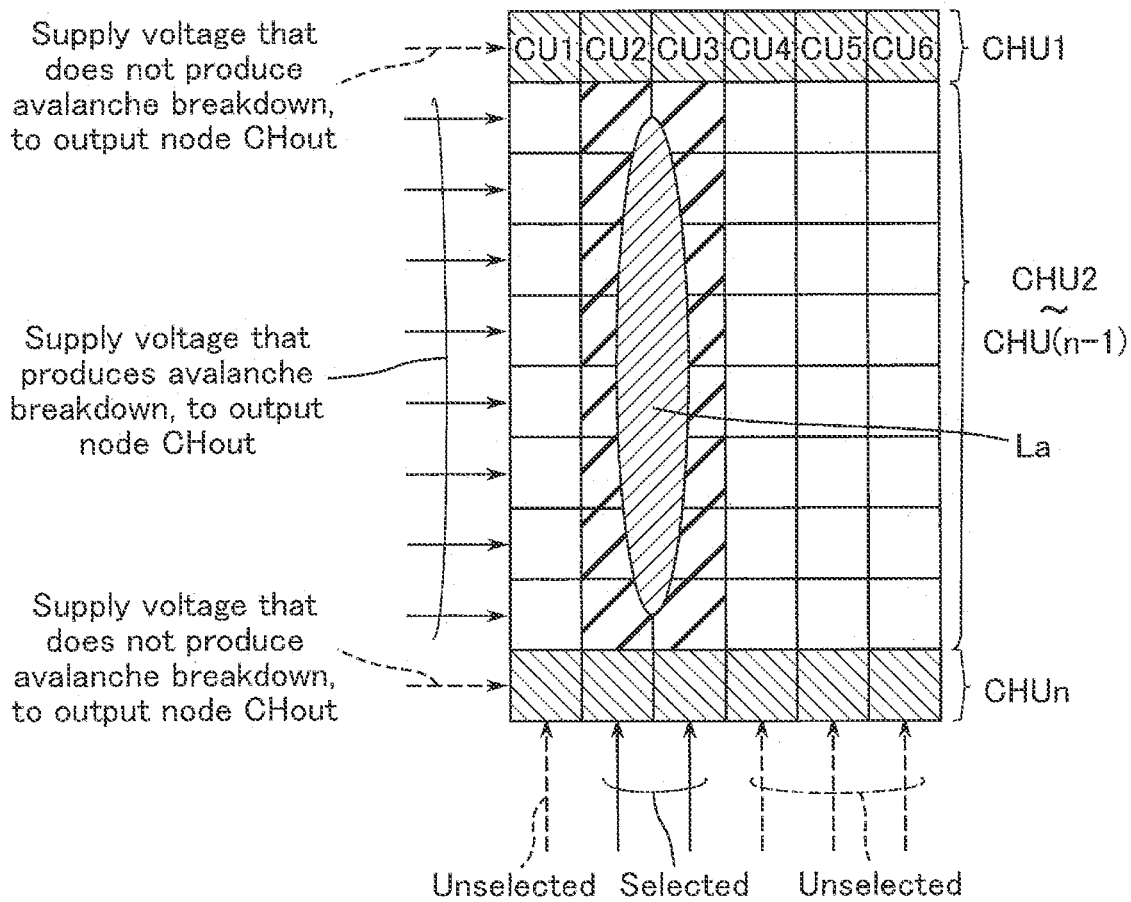
FIG. 11 is a schematic diagram for describing a selection process of a detection range of reflected light in the light detector according to the second embodiment.

Next, a selection process of a sensor surface in the distance measuring device according to the second embodiment will be described using FIG. 11. FIG. 11 corresponds to the left part (A) in FIG. 9 in the first embodiment.

As illustrated in FIG. 11, in a case where light La is received in a region in the sensor region SeR in which cell units CU2 and CU3 are arranged, signals with an "L" level are input to selection nodes SEL2 and SEL3 among selection nodes SEL, and signals with an "H" level are input to selection nodes SEL1, and SEL4 to SEL6. With this configuration, among the selection and integration circuits XFR, the switching elements T2 and T3 turn into the on state and switching elements D2 and D3 turn the off state. Thus, among channel units CHU, light detection elements DC in the cell units CU2 and CU3 are selectively electrically connected to the output node CHout.

On the other hand, among the selection and integration circuits XFR, switching elements T1 and T4 to T6 turn into the off state and switching elements D1 and D4 to D6 turn into the on state. Thus, among channel units CHU, light detection elements DC in the cell units CU1 and CU4 to CU6 are electrically connected to an output node DMout.

Accordingly, light to be received by the light detection elements DC in the cell units CU1 and CU4 to CU6 and noise being resultant influence of electrons can be excluded via the output node DMout. In addition, if the light is intense, saturation phenomenon of surrounding light detection elements DC that can be accordingly caused can be suppressed and an unavailable time that is based on saturation can be suppressed or reduced.

In addition, in the example in FIG. 11, voltage that does not initiate avalanche breakdown is supplied to output nodes CHout1 and CHoutn among output nodes CHout, and voltage that initiates avalanche breakdown is supplied to the remaining output nodes CHout2 to CHout(n−1). With this configuration, light detection elements DC in channel units CHU1 and CHUn corresponding to ends of the sensor region SeR become dummy cells in which avalanche breakdown is not initiated even if light is received. Thus, selection cell units CU in the channel units CHU1 and CHUn are set so as not to contribute to the output to the output node CHout. The inflow of electrons to the sensor region SeR from the upside or downside of the sensor region SeR can thereby be prevented, saturation phenomenon of light detection elements DC that is caused if light is intense can be suppressed, and an unavailable time that is based on saturation can be suppressed or reduced.

By causing the above-described operation, a portion of the sensor region SeR that contributes to output can be extracted more selectively.

2.3 Effect According to Present Embodiment

According to the second embodiment, the light detection element DC is coupled to the output node CHout via the switching element T and is coupled to the output node DMout via the switching element D. Signals Inverted by the inverter INV are input to the switching elements T and D corresponding to each other. All the cell units CU electrically disconnected from the output node CHout are thereby electrically connected to the output node DMout. Thus, influence of unintended light (e.g. environmental light) to be received by an unselected light receiving region to be exerted on the output node CHout can be suppressed. Accordingly, degradation in S/N ratio of an output signal can be suppressed. Furthermore, for example, if a large amount of photons are emitted into the sensor region SeR, Geiger current generated in an unselected cell unit CU can be prevented from flowing to the output node CHout and a saturated state of output can be alleviated.

In addition, while reverse bias that can initiate avalanche breakdown is applied to the light detection element DC coupled to the output node CHout, reverse bias that hardly initiates avalanche breakdown is applied to the light detection element DC coupled to the output node DMout. An amount of current flowing in the output node DMout can be thereby suppressed.

In addition, regions corresponding to the rim of the sensor region SeR are susceptible to environmental light emitted to the outside of the sensor region SeR. Thus, because regions corresponding to the rim of the sensor region SeR have a property that easily degrades a S/N ratio of an output signal, it is preferable that such regions are always set so as not to be selected.

According to the second embodiment, reverse bias that does not initiate avalanche breakdown even if light is received is applied to light detection elements DC positioned in regions corresponding to the rim of the sensor region SeR (specifically, channel units CHU1 and CHUn). In other words, voltage lower than other output nodes CHout2 to CHout(n−1) is supplied to the output nodes CHout1 and CHoutn. The light detection elements DC in the channel units CHU1 and CHUn can thereby be set to dummy cells in which Geiger current is not initiated even if light is received. Thus, influence of environmental light emitted to the outside of the sensor region SeR can be excluded and degradation in S/N ratio of an output signal can be suppressed.

3. Third Embodiment

Next, a distance measuring device according to a third embodiment will be described. The third embodiment differs from the first embodiment and the second embodiment in that correspondence relationship between a selection node SEL and a cell unit CU to be selected can be shifted to right or left between adjacent channel units CHU. Hereinafter, the description of configurations and operations that are equivalent to the first embodiment will be omitted, and configurations and operations that are different from the first embodiment will be mainly described.

3.1 Configuration of Light Detector

First, a functional configuration of the light detector according to the third embodiment will be described with reference to FIG. 12.

Figure 12:
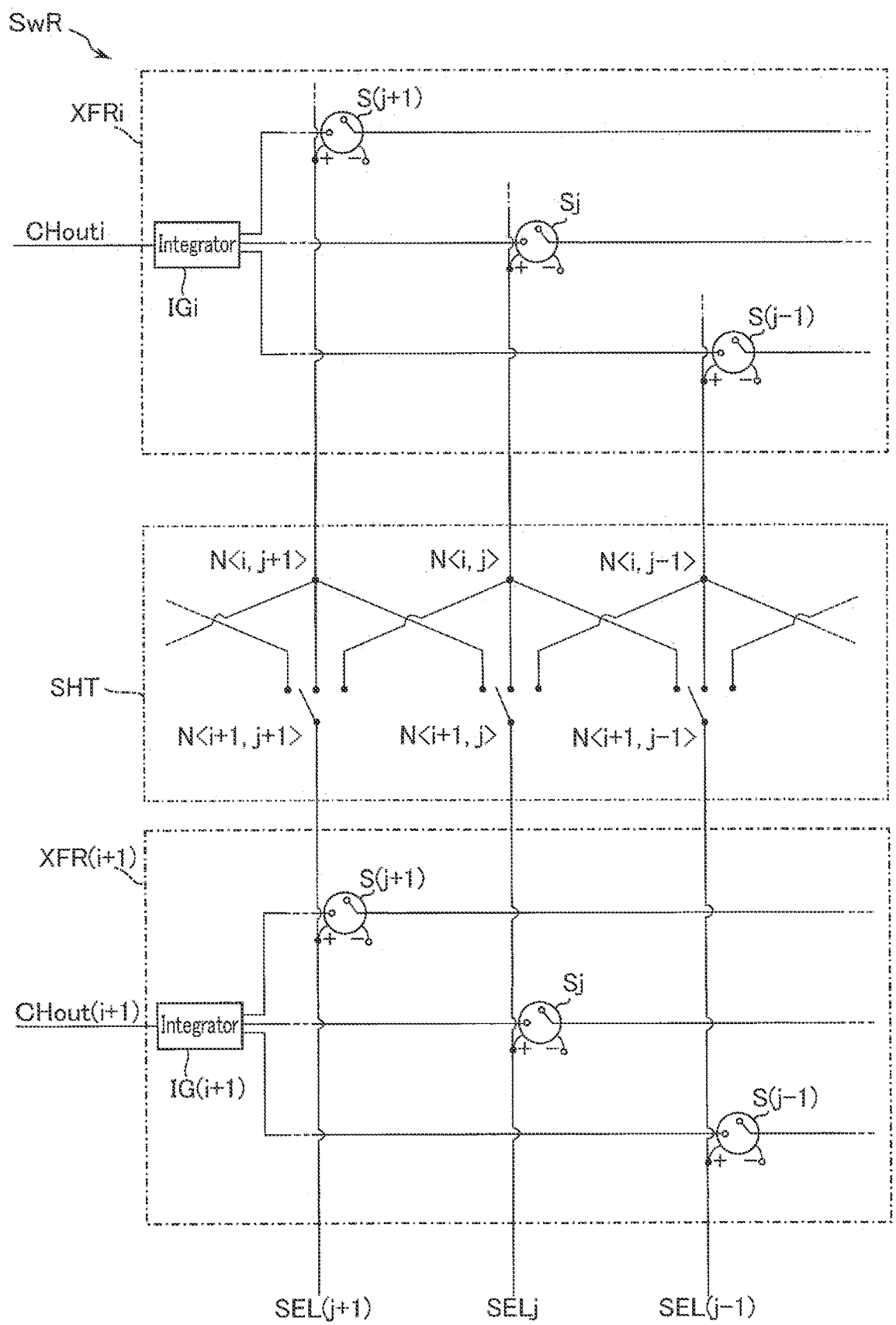
FIG. 12 is a block diagram for describing a functional configuration of a light detector according to a third embodiment.

FIG. 12 is a block diagram for describing a functional configuration of a light detector according to the third embodiment. FIG. 12 corresponds to FIG. 2 in the first embodiment. FIG. 12 mainly illustrates, among adjacent two selection and integration circuits XFRi and XFR(i+1) in a switch region SwR, and configurations provided therebetween, configurations corresponding to selection nodes SEL (j−1), SELj, and SEL (j+1) (1≤i≤n−1, 2≤j≤m−1). In FIG. 12, for the sake of explanatory convenience, circuit configurations of other selection and integration circuits XFR in the switch region SwR, and channel units CHU in a sensor region SeR are omitted.

As illustrated in FIG. 12, a shifter SHT is provided between the selection and integration circuit XFRi and the selection and integration circuit XFR(i+1). The shifter SHT has a function of coupling a selection node SELj coupled to a selector Sj in the selection and integration circuit XFR(i+1), to any one selected from selectors S (j+1), Sj, and S (j−1) in the selection and integration circuit XFRi.

More specifically, for example, in the selection and integration circuit XFRi, a node that supplies a selection signal to the selector Sj is indicated by N<i,j>, and a node N<i+1,j> is coupled to the selection node SELj. In this case, the shifter SHT couples the node N<i+1,j> to any of nodes N<i,j>, N<i,j+1>, and N<i,j−1>. In addition, the shifter SHT couples a node between the selection and integration circuits XFRi and XFR(i+1) in such a manner that all the selection nodes SEL are shifted in the same direction.

With the above-described configuration, as the selector S to be selected by the selection node SELj, while the selector Sj is selected in the selection and integration circuit XFR (i+1), the selector Sj can be shifted to the selector S(j+1) or S(j−1) in the selection and integration circuit XFRi.

Figure 13:
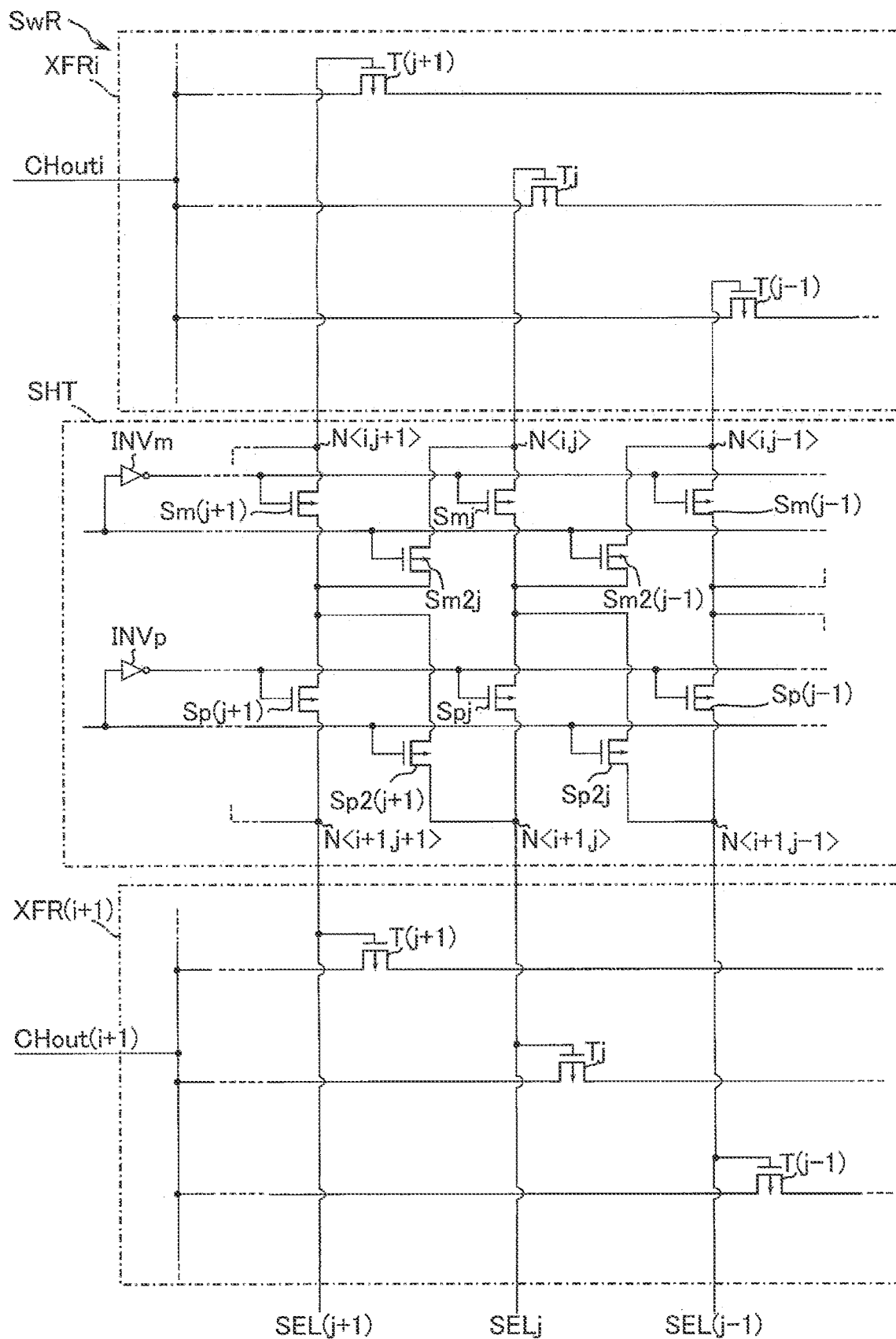
FIG. 13 is a circuit diagram for describing a circuit configuration of the light detector according to the third embodiment.

Next, a circuit configuration of the light detector according to the third embodiment will be described with reference to FIG. 13. FIG. 13 corresponds to FIG. 12, and illustrates an example of a specific circuit configuration to which the functional configuration of the light detector 14 illustrated in FIG. 12 is applied.

As illustrated in FIG. 13, switching elements Sm(j−1), Sm2(j−1), Smj, Sm2j, Sm(j+1), Sp(j−1), Spj, Sp2j, Sp(j+1), and Sp2(j+1), and inverters INVm and INVp are provided between the selection and integration circuit XFRi and the selection and integration circuit XFR(i+1), as configurations of the shifter SHT that correspond to the selection nodes SEL(j−1), SELj, and SEL(j+1). The switching elements Sm(j−1), Sm2(j−1), Smj, Sm2j, Sm(j+1), Sp(j−1), Spj, Sp2j, Sp(j+1), and Sp2(j+1) are MOS transistors having p-type conductivity, for example.

The switching elements Sm(j−1) and Sp(j−1) are coupled in series between a gate (i.e. node N<i,j−1>) of the switching element T(j−1) in the selection and integration circuit XFRi and a gate (i.e. node N<i+1,j−1>) of the switching element T(j−1) in the selection and integration circuit XFR(i+1). The switching elements Smj and Spj are coupled in series between a gate (i.e. node N<i,j>) of the switching element Tj in the selection and integration circuit XFRi, and a gate (i.e. node N<i+1,j>) of the switching element Tj in the selection and integration circuit XFR(i+1). The switching elements Sm(j+1) and Sp(j+1) are coupled in series between a gate (i.e. node N<i,j+1>) of the switching element T(j+1) in the selection and integration circuit XFRi and a gate (i.e. node N<i+1,j+1>) of the switching element T(j+1) in the selection and integration circuit XFR(i+1).

The switching element Sm2(j−1) is coupled between the node N<i,j−1> and the node N<i+1,j>. The switching element Sm2j is coupled between the node N<i,j> and the node N<i+1,j+1>.

The switching element Sp2j is coupled between the node N<i,j> and the node N<i+1,j−1>. The switching element Sp2(j+1) is coupled between the node N<i,j+1> and the node N<i+1,j>.

The inverter INVm includes an input end coupled in common to respective gates of the switching elements Sm2(j−1) and Sm2j, and an output end coupled in common to respective gates of the switching elements Sm(j−1), Smj, and Sm(j+1).

The inverter INVp includes an input end coupled in common to respective gates of the switching elements Sp2j and Sp2(j+1), and an output end coupled in common to respective gates of the switching elements Sp(j−1), Spj, and Sp(j+1).

With the above-described configuration, either one set of a set of the switching elements Sm(j−1), Smj, and Sm(j+1), and a set of the switching elements Sm2(j−1) and Sm2j is controlled to turn into the on state and the other set is controlled to turn into the off state, according to a logical level ("H" level or "L" level) input to the inverter INVm.

With this configuration, if the set of the switching elements Sm(j−1), Smj, and Sm(j+1) turns into the on state, the node N<i,j> is electrically connected to the node N<i+1,j> via the switching element Smj. Thus, if the switching element Tj in the selection and integration circuit XFR(i+1) is selected by the selection node SELj, the switching element Tj in the selection and integration circuit XFRi is also selected by the selection node SELj.

On the other hand, if the set of the switching elements Sm2(j−1) and Sm2j turns into the on state, the node N<i,j−1> is electrically connected to the node N<i+1,j> via the switching element Sm2(j−1). Thus, if the switching element Tj in the selection and integration circuit XFR(i+1) is selected by the selection node SELj, a switching element in the selection and integration circuit XFRi that is to be selected by the selection node SELj becomes the switching element T(j−1).

In this manner, by switching the state from a state in which the switching elements Sm(j−1), Smj, Sm(j+1) are in the on state, to a state in which the switching elements Sm2(j−1) and Sm2j turn into the on state, a switching element to be selected in the selection and integration circuit XFRi can be shifted from the switching element Tj to T(j−1). In addition, the shift corresponds to a shift of a selection region from the cell unit CUj to the cell unit CU(j−1) in the sensor region SeR. In the following description, the shift direction will also be referred to as a "−X direction".

In addition, either one set of a set of the switching elements Sp(j−1), Spj, and Sp(j+1), and a set of the switching elements Sp2j and Sp2(j+1) is controlled to turn into the on state and the other set is controlled to turn into the off state, according to a logical level ("H" level or "L" level) input to the inverter INVp.

With this configuration, if the set of the switching elements Sp(j−1), Spj, and Sp(j+1) turns into the on state, the node N<i,j> is electrically connected to the node N<i+1,j> via the switching element Spj. Thus, if the switching element Tj in the selection and integration circuit XFR(i+1) is selected by the selection node SELj, the switching element Tj in the selection and integration circuit XFRi is also selected by the selection node SELj.

On the other hand, if the set of the switching elements Sp2j and Sp2(j+1) turns into the on state, the node N<i,j+1> is electrically connected to the node N<i+1,j> via the switching element Sp2(j+1). Thus, if the switching element Tj in the selection and integration circuit XFR(i+1) is selected by the selection node SELj, a switching element in the selection and integration circuit XFRi that is to be selected by the selection node SELj becomes the switching element T(j+1).

In this manner, by switching the state from a state in which the switching elements Sp(j−1), Spj, Sp(j+1) are in the on state, to a state in which the switching elements Sp2j and Sp2(j+1) turn into the on state, a switching element to be selected in the selection and integration circuit XFRi can be shifted from the switching element Tj to T(j+1). In addition, the shift corresponds to a shift of a selection region from the cell unit CUj to the cell unit CU(j+1) in the sensor region SeR. In the following description, the shift direction will also be referred to as a "+X direction".

In the example in FIG. 13, a case where the set of the switching elements Sm(j−1), Smj, Sm(j+1), Sm2(j−1), and Sm2j is provided closer to the selection and integration circuit XFRi side than the set of the switching elements Sp(j−1), Spj, Sp(j+1), Sp2j, and Sp2(j+1) is illustrated, but the arrangement is not limited to this. In other words, the set of the switching elements Sm(j−1), Smj, Sm(j+1), Sm2(j−1), and Sm2j may be provided closer to the selection and integration circuit XFR(i+1) side than the set of the switching elements Sp(j−1), Spj, Sp(j+1), Sp2j, and Sp2(j+1).

In addition, the above-described configuration of the shifter needs not be always provided between all adjacent two selection and integration circuits XFRi and XFR(i+1).

3.2 Sensor Surface Selection Process

Figure 14:
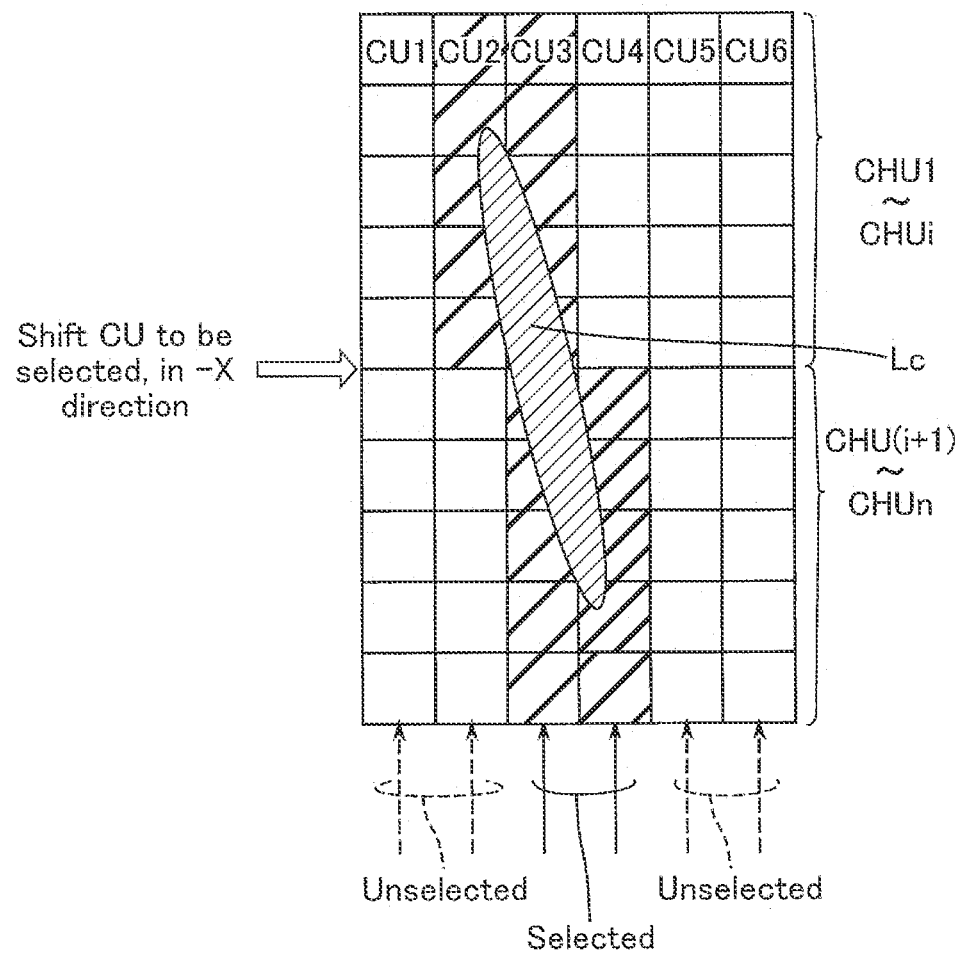
FIG. 14 is a schematic diagram for describing a selection process of a detection range of reflected light in the light detector according to the third embodiment.

Next, a selection process of a sensor surface in the distance measuring device according to the third embodiment will be described using FIG. 14. FIG. 14 illustrates a case where light Lc emitted to the sensor region SeR is distributed at a tilt in a direction in which channel units CHU are arranged (i.e. Y direction). More specifically, FIG. 14 illustrates a case where the light Lc is emitted to a region in which cell units CU2 and CU3 are arranged, in a range of channel units CHU1 to CHUi, and to a region in which cell units CU3 and CU4 are arranged, in a range of channel units CHU(i+1) to CHUn.

As illustrated in FIG. 14, among selection nodes SEL, signals with the "L" level are input to the selection nodes SEL3 and SEL4, and signals with the "H" level are input to the selection nodes SEL1, SEL2, SEL5, and SEL6. With this configuration, in the selection and integration circuits XFR(i+) to XFRn, the switching elements T3 and T4 turn into the on state and remaining switching elements T1, T2, T5, and T6 turn into the off state. Thus, among channel units CHU(i+1) to CHUn, light detection elements DC in the cell units CU3 and CU4 are selectively electrically connected to the output node CHout.

In the example in FIG. 14, the configuration of the shifter SHT described in FIG. 13 is provided between the selection and integration circuits XFRi and XFR(i+1), and various switching elements Sm and the inverter INVm are controlled in such a manner that a shift in the −X direction is executed. With this configuration, signals with the "L" level are input to the switching elements T2 and T3 in the selection and integration circuits XFR1 to XFRi from the selection nodes SEL3 and SEL4, and the switching elements T2 and T3 turn into the on state, and signals with the "H" level are input to the remaining switching elements T1, and T4 to T6 and the switching elements T1, and T4 to T6 turn into the off state. Thus, among channel units CHU1 to CHUi, light detection elements DC in the cell units CU2 and CU3 are selectively electrically connected to the output node CHout.

By causing the above-described operation, even if reflected light from the scanner and optical system 13 tilts in a direction in which channel units CHU are arranged, a portion contributing to output can be selectively extracted from the sensor region SeR.

3.3 Effect According to Present Embodiment

According to the third embodiment, the switch region SwR includes the switching element Sm and the inverter INVm that function as a shifter in the −X direction, and the switching element Sp and the inverter INVp that function as a shifter in the +X direction. With this configuration, even if the light Lc emitted to the sensor region SeR at every measurement cycle tilts in the sensor region SeR in a direction (Y direction) in which channel units CHU are arranged, an emission surface of the light Lc can be appropriately selected. In other words, cell units CU to be selected can be shifted so as to extend along the light Lc, by using a shifter in the +X direction if the light Lc tilts in the +X direction, or by using a shifter in the −X direction if the light Lc tilts in the −X direction. Thus, if the irradiation optical system and the light receiving system are shifted in optical axis, instead of adjusting the optical system, by using the shift function, adjustment can be electrically performed. The electrical adjustment can be automated by an apparatus equivalent to an apparatus described in Japanese Patent Application No. 2016-181776, filed Sep. 16, 2016, and an adjustment work can be automated. In addition, even if the shape of the light Lc shifts from an originally-expected shape due to aging degradation, vibration, or the like, an appropriate output signal can be obtained while suppressing degradation in S/N ratio.

4 Others

Hereinbefore, various embodiments have been described but the first to third embodiments are not limited to these and various modifications can be appropriately made.

For example, in the first to third embodiments, a case where MOS transistors having p-type conductivity are applied to various switching elements has been described, but the switching elements are not limited to this, and various switching elements may have n-type conductivity.

In addition, in the first to third embodiments, a case where the switching elements T1 to Tm are arranged in the −X direction, whereas the cell units CU1 to CUm are arranged in the +X direction has been described, but the arrangement is not limited to this. In other words, directions in switching elements T and cell units CU are arranged may be the same direction.

In addition, in the second embodiment, a case where light detection elements DC corresponding to channel units CHU1 and CHUn in the sensor region SeR are made dummy cells has been described, but dummy cells are not limited to these. For example, all the outer rim of the sensor region SeR may be made dummy cells. In other words, light detection elements DC corresponding to cell units CU1 and CUm may also be made dummy cells. In this case, light detection elements DC corresponding to cell units CU1 and CUm can be coupled to a interconnect different from the output node CHout to which other cell units CU are coupled, in such a manner that reverse bias that does not initiate avalanche breakdown is always supplied.

In addition, in the third embodiment, a case where the shifter is added to the configurations described in the first embodiment has been described, but configuration is not limited to this. In other words, as described in the second embodiment, the shifter can also be applied to the configuration including the switching element D.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A light detector comprising:
a first set of light detection elements and a second set of light detection elements each being disposed on a substrate; and
a first selection and integration circuit and a second selection and integration circuit each being disposed on the substrate, wherein
the first set of light detection elements includes a first plurality of subsets arranged in a first direction, each of the first plurality of subsets in the first set including at least one light detection element arranged in a second direction intersecting with the first direction,
the second set of light detection elements includes a second plurality of subsets arranged in the first direction, each of the second plurality of subsets in the second set including at least one light detection element arranged in the second direction,
the first selection and integration circuit is configured to select a first subset in the first set, and integrate outputs from the light detection elements in the first subset,
the second selection and integration circuit is configured to select a second subset in the second set, and integrate outputs from the light detection elements in the second subset,
all sets of the light detection elements included in the light detector on the substrate are arranged in the second direction, and
each of the sets of the light detection elements is a pixel.

2. The light detector of claim 1, wherein
each of the first set of light detection elements and the second set of light detection elements is disposed in a first region on a substrate,
each of the first selection and integration circuit and the second selection and integration circuit is disposed in a second region on the substrate,
the first region is a single region,
the second region is outside of the first region, and
the first region and the second region are arranged in the first direction.

3. The light detector of claim 1,
wherein the first selection and integration circuit includes a first switching element including a first end coupled in common to the at least one light detection element in the first subset.

4. The light detector of claim 3,
wherein the second selection and integration circuit includes a second switching element including a first end coupled in common to the at least one light detection element in the second subset, and a gate coupled to a gate of the first switching element.

5. The light detector of claim 4, wherein
the first selection and integration circuit further includes a third switching element including a first end coupled in common to the at least one light detection element in a third subset in the first set.

6. The light detector of claim 5,
wherein the second selection and integration circuit further includes a fourth switching element including a first end coupled in common to the at least one light detection element in a fourth subset in the second set, and a gate coupled to a gate of the third switching element.

7. The light detector of claim 1, wherein
the second selection and integration circuit selects the second subset with a same selection signal that the first selection and integration circuit selects the first subset.

8. The light detector of claim 7, wherein
the second selection and integration circuit is configured to shift a subset selected by the same selection signal from the second subset to a third subset in the second set arranged adjacent to the second subset along the first direction.

9. The light detector of claim 2, wherein
the second region is a single region in which all the selection and integration circuits included in the light detector on the substrate are arranged in the second direction.

10. A distance measuring device comprising:
a light source;
an optical system configured to irradiate a light from the light source and receive the light reflected from an outside;
the light detector of claim 1 configured to detect the received reflected light; and
a control circuit, wherein
the first selection and integration circuit is configured to select the first subset of light detection elements in the first set in response to a selection signal from the control circuit, and integrate outputs from the light detection elements in the first subset, and
the second selection and integration circuit is configured to select the second subset of light detection elements in the second set in response to the selection signal, and integrate outputs from the light detection elements in the second subset.

\* \* \* \* \*